United States Patent
Kuo et al.

(10) Patent No.: US 12,349,476 B2
(45) Date of Patent: Jul. 1, 2025

(54) RECESSED BLOCKING STRUCTURE FOR BLC PIXELS

(71) Applicant: Taiwan Semiconductor Manufacturing Company, Ltd., Hsinchu (TW)

(72) Inventors: Chun-Tsung Kuo, Tainan (TW); Jiech-Fun Lu, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 449 days.

(21) Appl. No.: 17/749,390

(22) Filed: May 20, 2022

(65) Prior Publication Data

US 2023/0378230 A1    Nov. 23, 2023

(51) Int. Cl.
*H01L 27/146* (2006.01)
*H10F 39/00* (2025.01)
*H10F 39/18* (2025.01)

(52) U.S. Cl.
CPC ........... *H10F 39/024* (2025.01); *H10F 39/18* (2025.01); *H10F 39/803* (2025.01); *H10F 39/8053* (2025.01); *H10F 39/8063* (2025.01)

(58) Field of Classification Search
CPC ........... H01L 31/0232; H01L 27/14643; H01L 27/14623
See application file for complete search history.

(56) References Cited

U.S. PATENT DOCUMENTS

| | | | |
|---|---|---|---|
| 6,617,189 B1* | 9/2003 | Chen | H01L 27/14621 257/233 |
| 9,247,116 B2 | 1/2016 | Chien et al. | |
| 11,309,342 B2 | 4/2022 | Tsao et al. | |
| 11,646,334 B2* | 5/2023 | Suzuki | H01L 27/14612 257/432 |
| 2017/0243912 A1* | 8/2017 | Kaneda | H01L 27/14627 |
| 2020/0075643 A1* | 3/2020 | Han | H01L 27/14621 |
| 2022/0068991 A1* | 3/2022 | Tanaka | H01L 27/14623 |
| 2023/0207592 A1* | 6/2023 | Watanabe | H01L 27/14629 257/572 |

* cited by examiner

*Primary Examiner* — Kyoung Lee
*Assistant Examiner* — David J Goodwin
(74) *Attorney, Agent, or Firm* — Eschweiler & Potashnik, LLC

(57) ABSTRACT

Various embodiments of the present disclosure are directed towards an image sensor. The image sensor includes a plurality of photodetectors disposed within a substrate, and the plurality of photodetectors includes a first active photodetector and a black level correction (BLC) photodetector. A metal grid structure surrounds the first active photodetector along a periphery of the first active photodetector on a first side of the substrate. A recessed blocking structure covers the BLC photodetector on the first side of the substrate. The recessed blocking structure includes both a first blocking layer inset into the first side of the substrate and a second blocking layer directly over the first blocking layer.

20 Claims, 18 Drawing Sheets

RECESSED BLOCKING STRUCTURE FOR BLC PIXELS

BACKGROUND

Many modern-day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) pixel sensors and complementary metal-oxide-semiconductor (CMOS) pixel sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
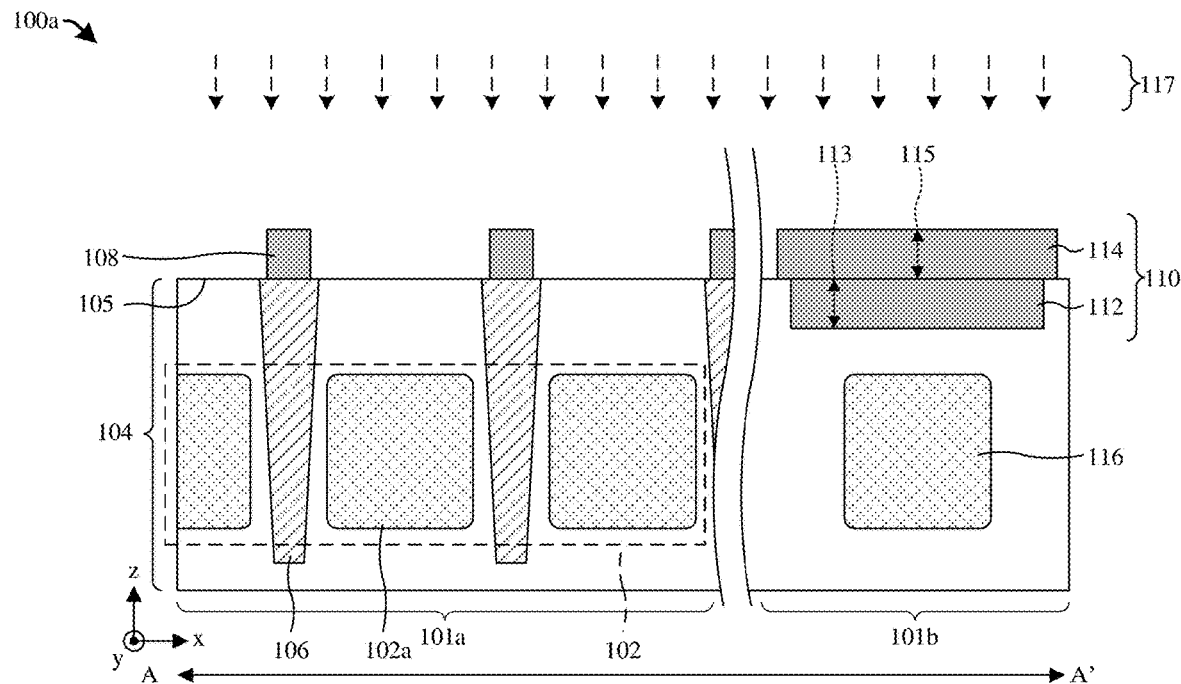
FIGS. 1A-1B illustrate various views of an image sensor having a recessed blocking structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include a plurality of photodetectors disposed in a device region of a semiconductor substrate. A plurality of pixel transistors (e.g., transfer transistors, source-follower transistors, reset transistors, etc.) and an interconnect structure are disposed along a frontside of the semiconductor substrate.

A metal grid structure and a blocking structure are disposed along a backside of the semiconductor substrate, opposite the frontside of the semiconductor substrate. The metal grid structure has a plurality of grid openings respectively and directly overlying active photodetectors in the plurality of photodetectors. A plurality of light filters are disposed within the grid openings. The blocking structure is disposed around a periphery of the metal grid structure and comprises one or more metal layers that extend directly over a black level correction (BLC) photodetector in the plurality of photodetectors. The blocking structure blocks incident radiation from reaching the BLC photodetector, which allows the BLC photodetector to provide a reference for signals that the active photodetectors would output without any external stimuli. If incident radiation reaches the BLC photodetector, the performance of the BLC photodetector suffers and its ability to correct an image's brightness or remove the effects of dark current from the final result will be less accurate.

The blocking structure has a certain threshold thickness to effectively block incident radiation from reaching the BLC photodetector. This thickness is larger than an optimal thickness for the metal grid structure and is typically formed by one of two processes: a first process; and a second process. According to the first process, one solid metal layer is formed into both the metal grid structure and the blocking structure. However, utilizing one solid metal layer does not scale at lower pixel sizes, as the aspect ratio of grid segments within the metal grid structure becomes difficult to produce uniformly. This may cause variations in the light level that reaches the active photodetectors, which would lower the quality of the resulting image.

According to the second process, multiple metal layers, a first metal layer and a second metal layer, are used to form a tapered blocking structure extending to the threshold thickness over the BLC photodetector and sloping to the thickness of the metal grid structure. However, the tapered blocking structure has variations in its topography that make it difficult to develop photoresist and etch the second metal grid layer into the metal grid structure at lower pixel sizes. These variations cause an uneven mask to be applied around the tapered blocking structure and can potentially cause the mask to not develop properly due to the low depth of focus.

This can lead to voids being formed in the second metal layer. The voids cause the thickness of the tapered blocking structure to fall below the threshold thickness in several places, thereby degrading the performance of the BLC photodetector. Further, the void can cause variations in the deposition of additional layers over the tapered blocking structure.

Various embodiments of the present disclosure are directed towards an improved method for forming a blocking structure. A plurality of photodetectors is formed in a substrate, and the plurality of photodetectors comprises a plurality of active photodetectors and a black level correction (BLC) photodetector. A first side of the substrate is etched to form a recess overlying the BLC photodetector. A first metal layer is deposited filling the recess on the first side of the substrate, and portions of the first metal layer outside the recess are removed to form a first blocking layer in the recess. A second metal layer is deposited covering the first blocking layer on the first side of the substrate. The second metal layer is then patterned to form a metal grid structure and a second blocking layer. The metal grid structure has a grid-shaped layout surrounding a plurality of openings respectively overlying the active pixels. The first and second blocking layers collectively form the blocking structure.

Because the first blocking layer is recessed into the first side of the substrate, the blocking structure is also recessed into the first side of the substrate and may also be referred to as a recessed blocking structure. Because the blocking structure is recessed into the first side of the substrate, whereas the metal grid structure is not, the blocking structure may have a thickness (or height) that is independent from the thickness (or height) of the metal grid structure. For example, the blocking structure may have a thickness that is effective at blocking incident radiation, whereas the metal grid structure may have a lesser thickness that does not cause non-uniformity while forming the metal grid structure at lower pixel sizes.

Because the metal grid structure and the second blocking layer are formed from the same layer (e.g., the second metal layer), the second blocking layer and hence the blocking structure may have an uppermost surface substantially level with that of the metal grid structure. As such, there may be little to no topographical variation at the blocking structure. This may enhance process uniformity while forming the metal grid structure and the blocking structure and may further enhance thickness uniformity of blocking structure. Such enhanced uniformity may, in turn, enhance performance of the image sensor.

Figure 1B:
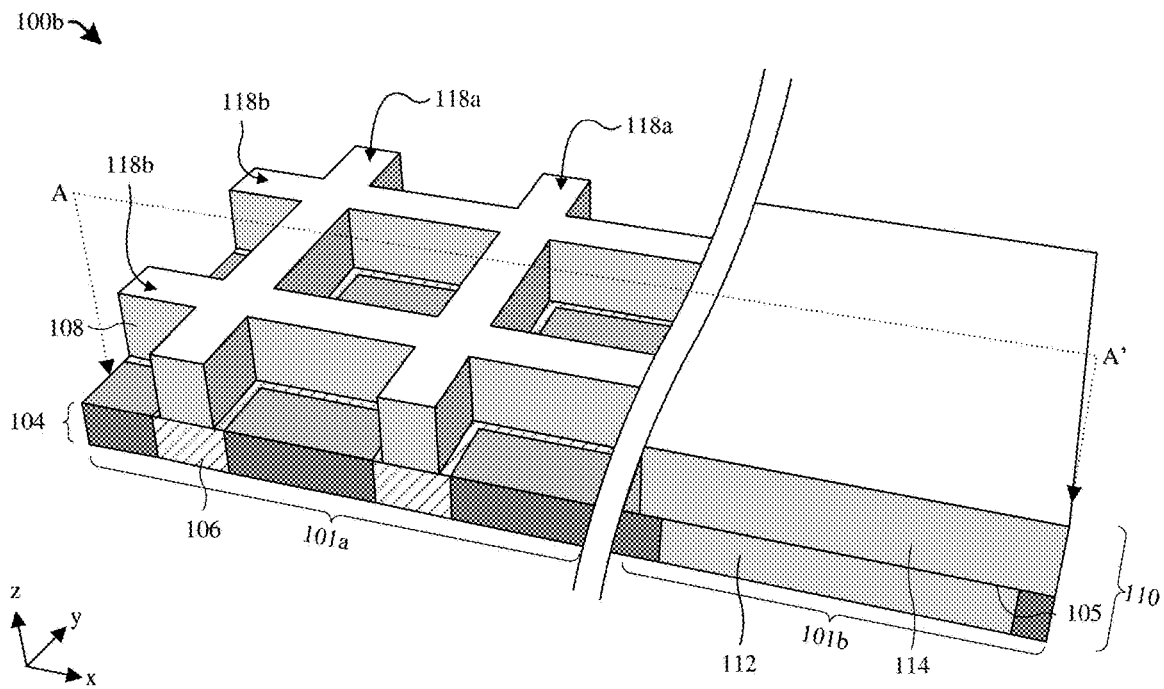

FIGS. 1A-1B illustrate various views 100a-100b of an image sensor having a recessed blocking structure 110. FIG. 1A illustrates a cross-sectional view 100a of some embodiments of the image sensor. FIG. 1B illustrates a perspective view 100b of some embodiments of the image sensor illustrated in FIG. 1A. The cross-sectional view 100a of FIG. 1A is taken along line A-A' of FIG. 1B.

As shown in the various views 100a-100b of FIGS. 1A-1B, an image sensor comprises a plurality of photodetectors disposed in a semiconductor substrate 104. The plurality of photodetectors comprises a plurality of active photodetectors 102 at a central region 101a of the image sensor, and further comprises a BLC photodetector 116 at a peripheral region 101b of the image sensor. Further, the plurality of active photodetectors 102 comprises a first active photodetector 102a. The plurality of photoreactors is configured to absorb incident radiation (e.g., photons) and generate respective electrical signals corresponding to the incident radiation. In some embodiments, the semiconductor substrate 104 comprises a bulk substrate of monocrystalline silicon or the like, a silicon-on-insulator (SOI) substrate, or some other suitable type of semiconductor substrate. Further, in some embodiments, the semiconductor substrate 104 comprises monocrystalline silicon, germanium (Ge), silicon-germanium (SiGe), a group III-V semiconductor, the like, or any combination of the foregoing.

In some embodiments, an isolation structure 106 is disposed over/in the semiconductor substrate 104. The isolation structure 106 extends into the semiconductor substrate 104 to separate the active and BLC photodetectors 102, 116 from each other. In some embodiments, the isolation structure 106 laterally surrounds the first active photodetector 102a. In further embodiments, the isolation structure 106 extends into the semiconductor substrate 104 from a first side 105 of the semiconductor substrate 104.

A metal grid structure 108 is on the first side 105 of the semiconductor substrate 104 and is at the central region 101a of the image sensor. Further, the metal grid structure 108 individually surrounds the plurality of active photodetectors 102 along peripheries of the plurality of active photodetectors 102. For example, the metal grid structure 108 may extend in a closed path around, and along a periphery of, the first active photodetector 102a to surround the first active photodetector 102a. The metal grid structure 108 comprises a first plurality of elongated grid segments 118a and a second plurality of elongated grid segments 118b. The first plurality of elongated grid segments 118a are arranged in parallel with one another and extend laterally in a first direction (along the y-axis). The second plurality of elongated grid segments 118b are arranged in parallel with one another and extend laterally in a second direction (along the x-axis) that is orthogonal to the first direction. The first plurality of elongated grid segments 118a intersect the second plurality of elongated grid segments 118b and has a plurality of grid openings that extend vertically through the metal grid structure 108. The metal grid structure 108 is or comprises, for example, tungsten (W), aluminum (Al), titanium (Ti), tantalum (Ta), some other suitable metal, or a combination of the foregoing.

A recessed blocking structure 110 surrounds the metal grid structure 108 on the first side 105 of the semiconductor substrate 104 and is at the peripheral region 101b of the image sensor. Unlike the metal grid structure 108, the recessed blocking structure 110 does not have grid openings. In some embodiments, the metal grid structure 108 extends continuously from the central region 101a to the peripheral region 101b. In other embodiments, there is a gap between the metal grid structure 108 and the recessed blocking structure 110.

A top surface of the recessed blocking structure 110 is level with a top surface of the metal grid structure 108 and has a thickness greater than a thickness of the metal grid structure 108. The recessed blocking structure 110 comprises a first blocking layer 112 inset into the first side 105 of the semiconductor substrate 104 and a second blocking layer 114 directly over the first side 105 and the first blocking layer 112. In some embodiments, the second blocking layer 114 has a height 115 that is substantially equal to a depth 113 to which the first blocking layer 112 is inset into the first side 105 of the semiconductor substrate 104. In some embodiments, the first blocking layer 112 has a lesser width than the second blocking layer 114. The recessed blocking structure 110 is or comprises, for example, tungsten (W), aluminum (Al), titanium (Ti), tantalum (Ta), some other suitable metal, or a combination of the foregoing. In some embodiments, the recessed blocking structure 110 and the metal grid structure 108 share a common material. For example, both the recessed blocking structure 110 and the metal grid structure 108 are tungsten (W).

The recessed blocking structure 110 is configured to block (e.g., completely block) incident radiation 117 from being transmitted to the BLC photodetector 116 disposed at the peripheral region 101b of the image sensor. In some embodiments, the recessed blocking structure 110 adequately blocks the incident radiation 117 by having a thickness that is in excess of a threshold thickness and that is equal to or greater than a summation of individual thicknesses of the first and second blocking layers 112, 114. In at some of such embodiments, if only one of the first blocking layer 112 or the second blocking layer 114 was disposed over the BLC photodetector 116, some incident radiation 117 would undesirably pass to the BLC photodetector 116. The BLC photodetector 116 is configured to provide a reference signal for BLC of the image sensor. As such, if incident radiation 117 passed to the BLC photodetector 116, the BLC of the image sensor may suffer, thereby reducing a performance of the image sensor.

In some embodiments, the threshold thickness of the recessed blocking structure 110 is about 2000 angstroms (Å), is about 1500-2500 Å, is about 1500-2000 Å, is about 2000-2500 Å, or is greater than about 2000 Å. Other suitable thicknesses are within the contemplated scope of the disclosure. In some embodiments, the first blocking layer 112 and the second blocking layer 114 have a combined thickness greater than the threshold thickness. In some embodiments, the combined thickness is approximately 2000-3000 Å, is approximately 2000-2500 Å, is approximately 2500-3000 Å, or is some other suitable thickness. In some embodiments, a thickness of the recessed blocking structure 110 the same as the combined thickness.

If the combined thickness of the first blocking layer 112 and the second blocking layer 114 is too small (e.g., less than approximately 2000 Å), there may be light that reaches the BLC photodetector 116. If the combined thickness is too large (e.g., greater than approximately 3000 angstroms), the process used to form the recessed blocking structure 110 may be prohibitively time-consuming and wasteful, and the recessed blocking structure 110 may be prohibitively large and interfere with the space used by other components. Further, the process used to form the recessed blocking structure 110 may cause greater topographical variation that leading to a less evenly layered and developed masks.

In some embodiments, the depth 113 of the first blocking layer 112 is the same as or about the same as the height 115 of the second blocking layer 114. For example, the depth 113 and the height 115 may be about 1000 Å or the like. In some embodiments, the depth 113 has a value within 10% of the height 115. For example, for a depth 113 of 1000 Å, the height 115 is about 1000 Å, is about 1000-1100 Å, is about 900-1000 Å, or is greater than 900 Å. Other suitable thicknesses are within the contemplated scope of the disclosure. As described above, because the first blocking layer 112 is formed independently of the metal grid structure 108, the recessed blocking structure 110 may have a thickness that is decoupled from the thickness of the metal grid structure 108. Therefore, the thickness of the recessed blocking structure 110 may exceed the threshold thickness without degrading the uniformity of the metal grid structure 108.

In some embodiments, a thickness of the metal grid structure 108 is half or about half a thickness of the recessed blocking structure 110. For example, the thickness of the metal grid structure 108 may be about 1000 Å or the like. In some embodiments, the thickness of the metal grid structure 108 is the same as or about the same as a thickness of the first blocking layer 112 and/or a thickness of the second blocking layer 114.

Figure 2A:
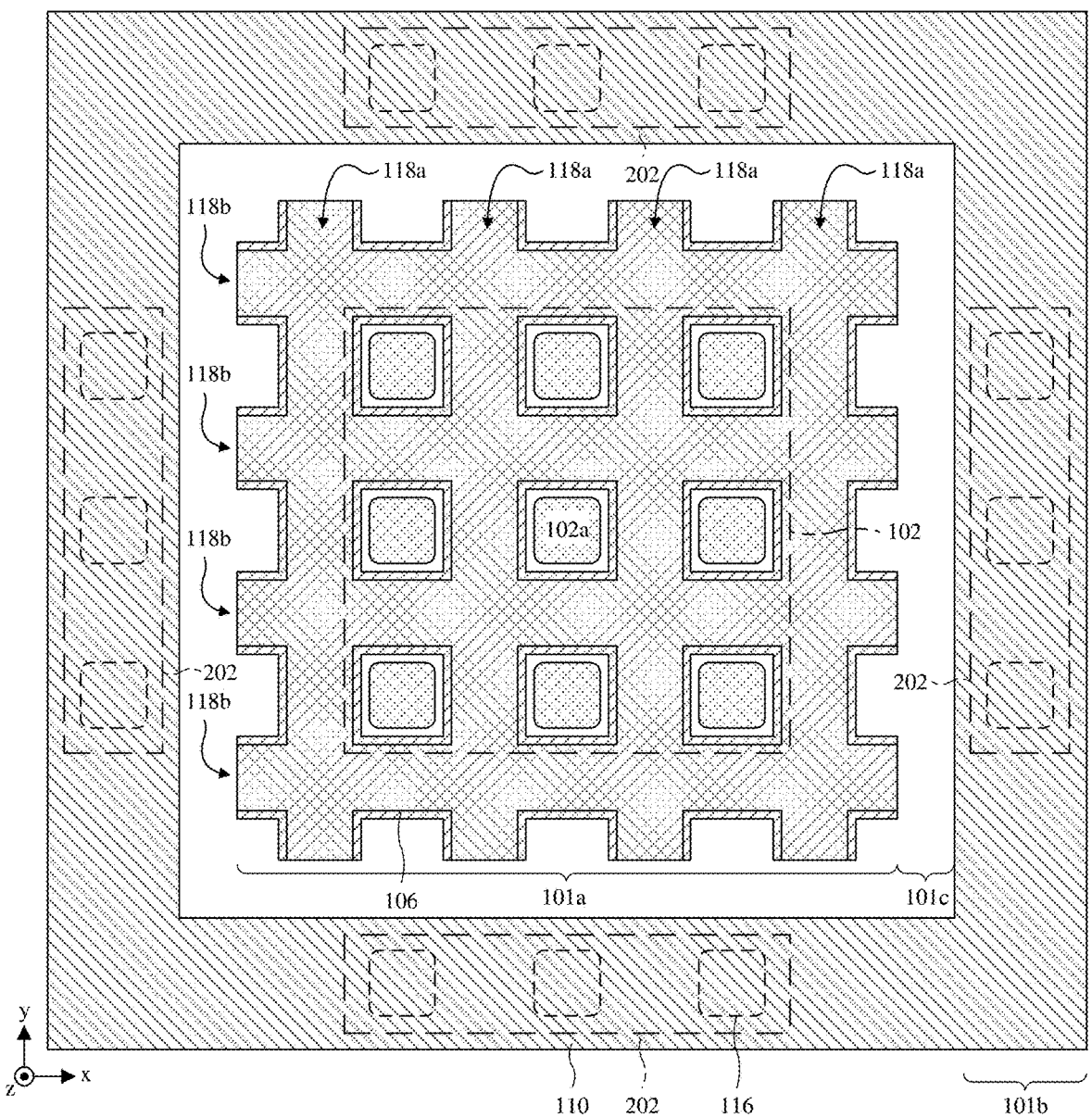
FIGS. 2A-2B illustrate top layout views of some different embodiments of a metal grid structure and the blocking structure of the image sensor of FIGS. 1A-1B.
Figure 2B:
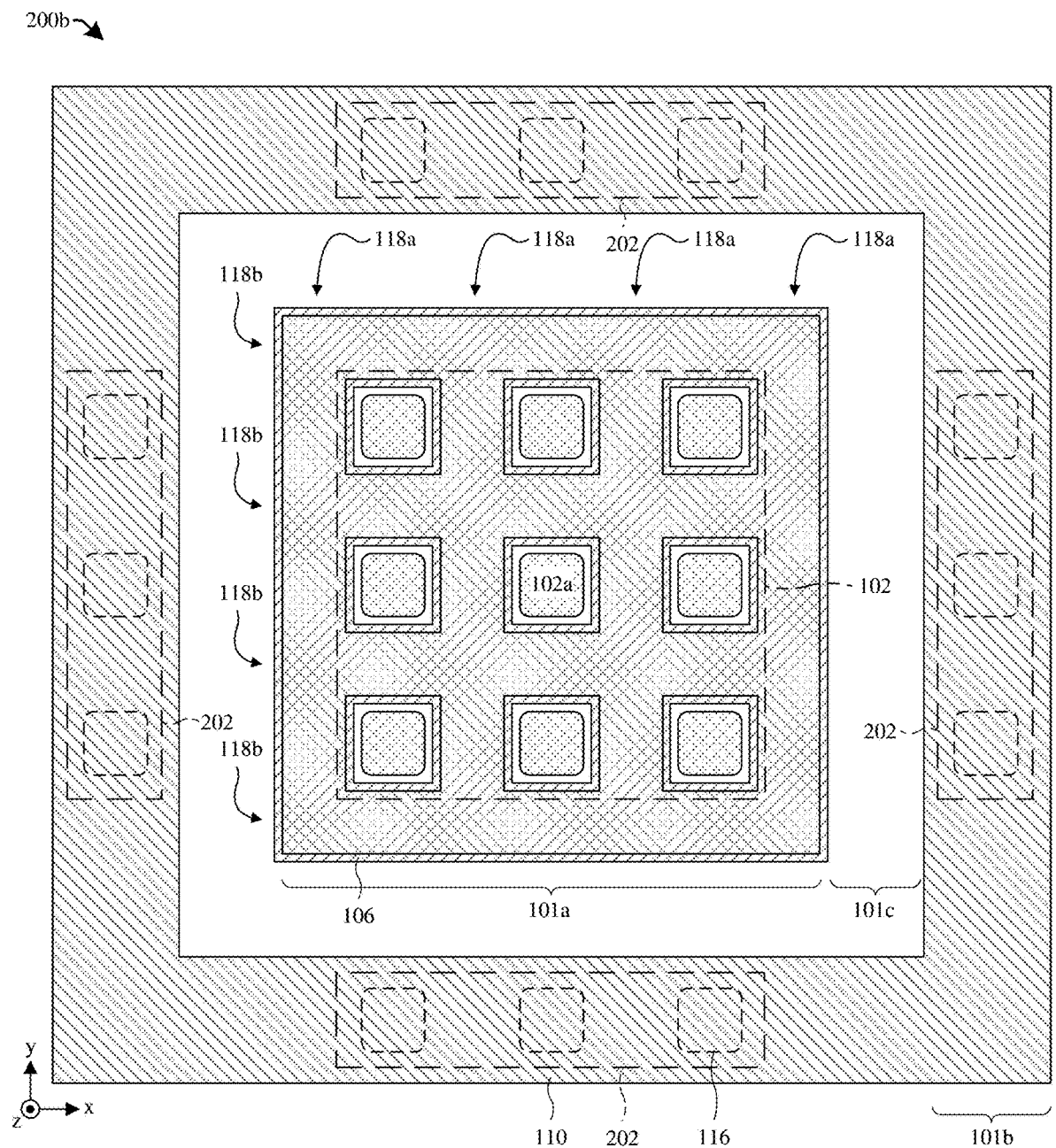

FIGS. 2A-2B illustrate top layout views 200a-200b of some different embodiments of the metal grid structure 108 and the recessed blocking structure 110 of the image sensor of FIGS. 1A-1B. For clarity, the top layout views 200a-200b of FIGS. 2A-2B does not illustrate the semiconductor substrate 104 in FIGS. 1A-1B.

As shown in the top layout views 200a, 200b of FIGS. 2A-2B, the metal grid structure 108 is at the central region 101a of the image sensor. Further, the metal grid structure 108 is on the isolation structure 106. The isolation structure 106 forms a grid shape complementary to that of the metal grid structure 108 and separating the metal grid structure 108 from the semiconductor substrate 104 (better seen at, e.g., FIGS. 1A-1B). The plurality of active photodetectors 102 are individually surrounded by the first plurality of elongated grid segments 118a and the second plurality of elongated grid segments 118b. The BLC photodetector 116 (shown in phantom) is directly beneath the recessed blocking structure 110. In some embodiments, a plurality of BLC photodetectors 202, including the BLC photodetector 116, are directly beneath the recessed blocking structure 110. In some embodiments, the parallel segments forming the grid shape of the isolation structure 106 are separated by a distance that is less than 0.6 micrometers (μm).

In FIG. 2A, ends of the first plurality of elongated grid segments 118a of the metal grid structure 108 extend beyond the second plurality of elongated grid segments 118b, and ends of the second plurality of elongated grid segments 118b extend beyond the first plurality of elongated grid segments 118a. In FIG. 2B, ends of the first plurality of elongated grid segments 118a of the metal grid structure 108 are even with the second plurality of elongated grid segments 118b, and ends of the second plurality of elongated grid segments 118b are even with the first plurality of elongated grid segments 118a.

The recessed blocking structure 110 is at the peripheral region 101b of the image sensor. In some embodiments, the peripheral region 101b laterally encloses the central region 101a. The recessed blocking structure 110 extends laterally in a closed loop path, such that the recessed blocking structure 110 laterally encloses the metal grid structure 108. In some embodiments, the recessed blocking structure 110 has a ring-like top layout (e.g., a square ring-like top layout or the like). In such embodiments, the recessed blocking structure 110 may be referred to as a ring-like peripheral metal structure.

The image sensor further has a gap region 101c between and separating the central region 101a and the peripheral region 101b. In alternative embodiments, the gap region 101c is omitted. Further, the metal grid structure 108 does not extend into the gap region 101c, such that the metal grid structure 108 is spaced from the recessed blocking structure 110. In some embodiments, the isolation structure 106 extends into the gap region 101c. In some embodiments, the gap region 101c is between 0 and 10 micrometers wide, 0 and 5 micrometers wide, 5 and 20 micrometers wide, or another, similar range.

Figure 3A:
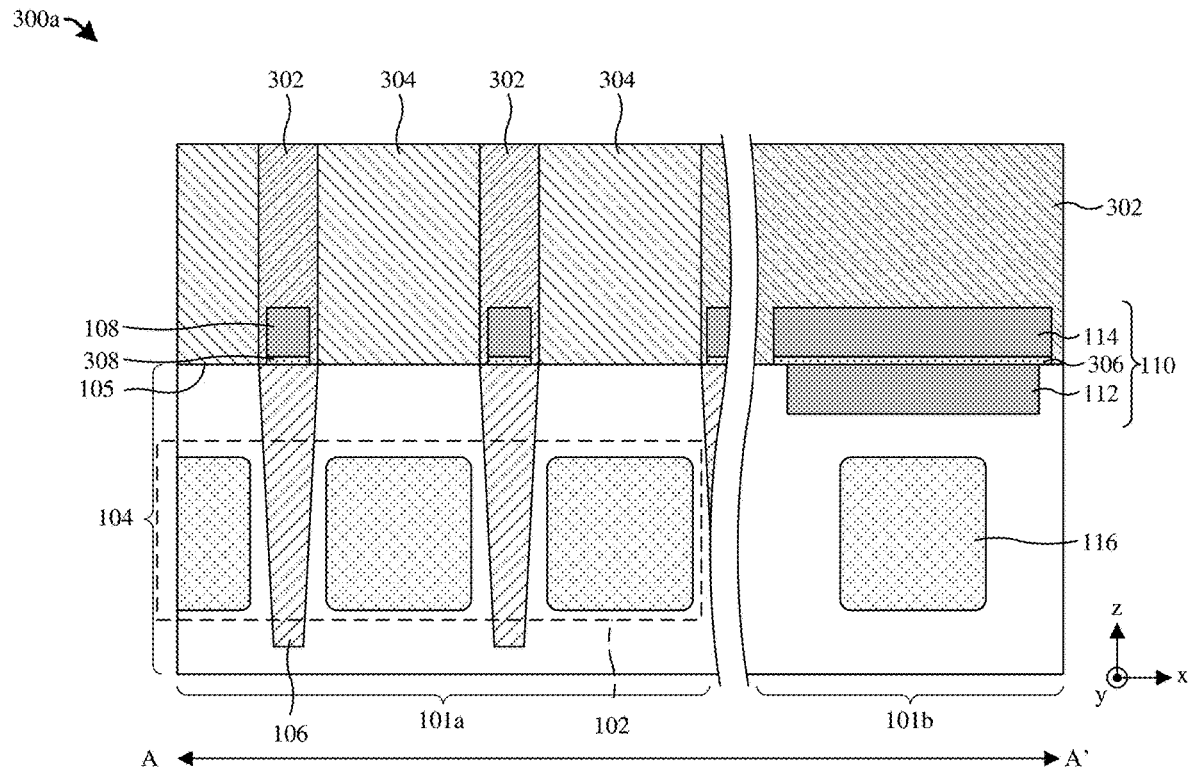
FIGS. 3A-3B illustrate various views of some other embodiments of the image sensor illustrated in FIGS. 1A-1B.
Figure 3B:
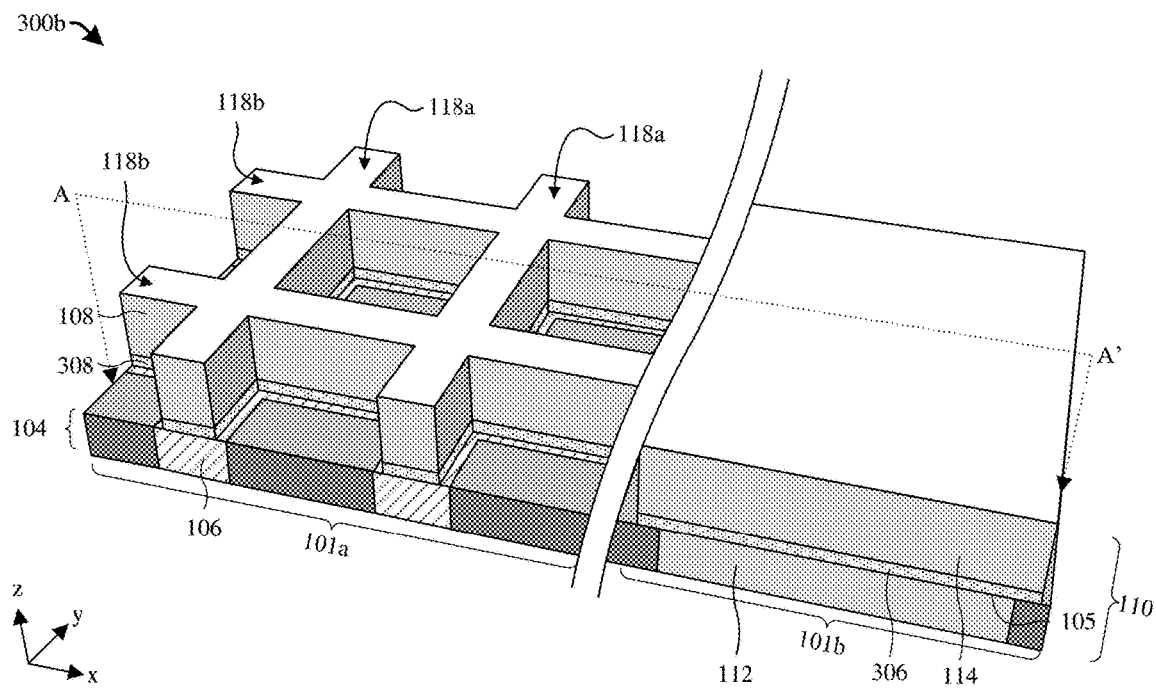

FIGS. 3A-3B illustrate various views 300a-300b of some other embodiments of the image sensor illustrated in FIGS. 1A-1B. FIG. 3A illustrates a cross-sectional view 300a of some embodiments of the image sensor. FIG. 3B illustrates a perspective view 300b of some embodiments of the image sensor illustrated in FIG. 3A. The cross-sectional view 300a of FIG. 3A is taken along line A-A' of FIG. 3B.

As shown in the cross-sectional view 300a of FIG. 3A, the metal grid structure 108 and the recessed blocking structure 110 are covered and surrounded by a dielectric structure 302. Further, a plurality of light filters 304 are disposed over the active and BLC photodetectors 102, 116 within the dielectric structure 302 and the metal grid structure 108. The plurality of light filters 304 are disposed in a light filter array comprising a plurality of rows and columns. In some embodiments, each light filter of the plurality of light filters 304 is directly over each active photodetector 102. In further embodiments, the plurality of light filters 304 are configured to transmit specific wavelengths (or specific ranges of wavelengths). For example, a first light filter is configured to transmit light (e.g., photons having a wavelength between approximately 10 nm and approximately 1 mm) having wavelengths in a first range, a second light filter is configured to transmit light having wavelengths in a second range different than the first range, and a third light filter is configured to transmit light having wavelengths in a third range different than the first and second range. In some embodiments, the plurality of light filters 304 may be color filters. For example, the first light filter may be a red color filter, the second light filter may be a green color filter, and the third light filter may be a blue color filter. In some embodiments, the plurality of light filters 304 may be infrared (IR) filters configured to filter incident radiation 117 (see, e.g., FIGS. 1A-1B) having an IR wavelength. In further embodiments, the plurality of light filters 304 may comprise a combination of color filters and/or IR filters.

The plurality of light filters 304 are or comprise a light filtering material. In some embodiments, the light filtering material is or comprises, for example, a photoresist (e.g., a positive/negative photoresist) comprising a dye/pigment, a dispersant polymer, a polymerization monomer, and/or other chemicals (e.g., chemicals for the polymerization reaction). In some embodiments, the light filtering material has a first refractive index, and the dielectric structure 302 has a second refractive index that is less than the first refractive index. In further embodiments, the dielectric material is a low refractive index (low-n) material (e.g., a material having a refractive index less than about 1.5).

As described above, the dielectric structure 302 covers and surrounds the metal grid structure 108 and the recessed blocking structure 110. The dielectric structure 302 has a grid-shaped portion covering and complementary to the metal grid structure 108. Further, the grid-shaped portion surrounds the metal grid structure 108. In some embodiments, the grid-shaped portion of the dielectric structure 302 is disposed laterally between (directly between) the plurality of light filters 304 and the metal grid structure 108. Further, in some embodiments, the grid-shaped of the dielectric structure 302 is laterally between (directly between) the plurality of light filters 304 and the recessed blocking structure 110. In some embodiments, an upper surface of the dielectric structure 302 is substantially co-planar with an upper surface of the plurality of light filters 304. In some embodiments, the dielectric structure 302 may be or comprise, for example, an oxide (e.g., SiO$_2$), a nitride (e.g., SiN), an oxynitride (e.g., SiO$_X$N$_Y$), or the like.

In some embodiments, a first etch stop layer 306 is part of the recessed blocking structure 110 and separates the first blocking layer 112 and the second blocking layer 114 from each other. Further, in some embodiments, the first etch stop layer 306 separates the second blocking layer 114 from the first side 105 of the semiconductor substrate 104. In some embodiments, the thickness of the recessed blocking structure 110 is greater than two times the thickness of the metal grid structure 108.

In some embodiments, a second etch stop layer 308 separates the metal grid structure 108 from the semiconductor substrate 104 and the isolation structure 106. In some embodiments, the second etch stop layer 308 is the same thickness as the first etch stop layer 306. Further, in some embodiments, the second etch stop layer 308 is the same material as the first etch stop layer 306.

FIGS. 4A-4D illustrates various cross-sectional views 400a-400d of some different embodiments of the image sensor illustrated in FIGS. 1A-1B.

Figure 4A:
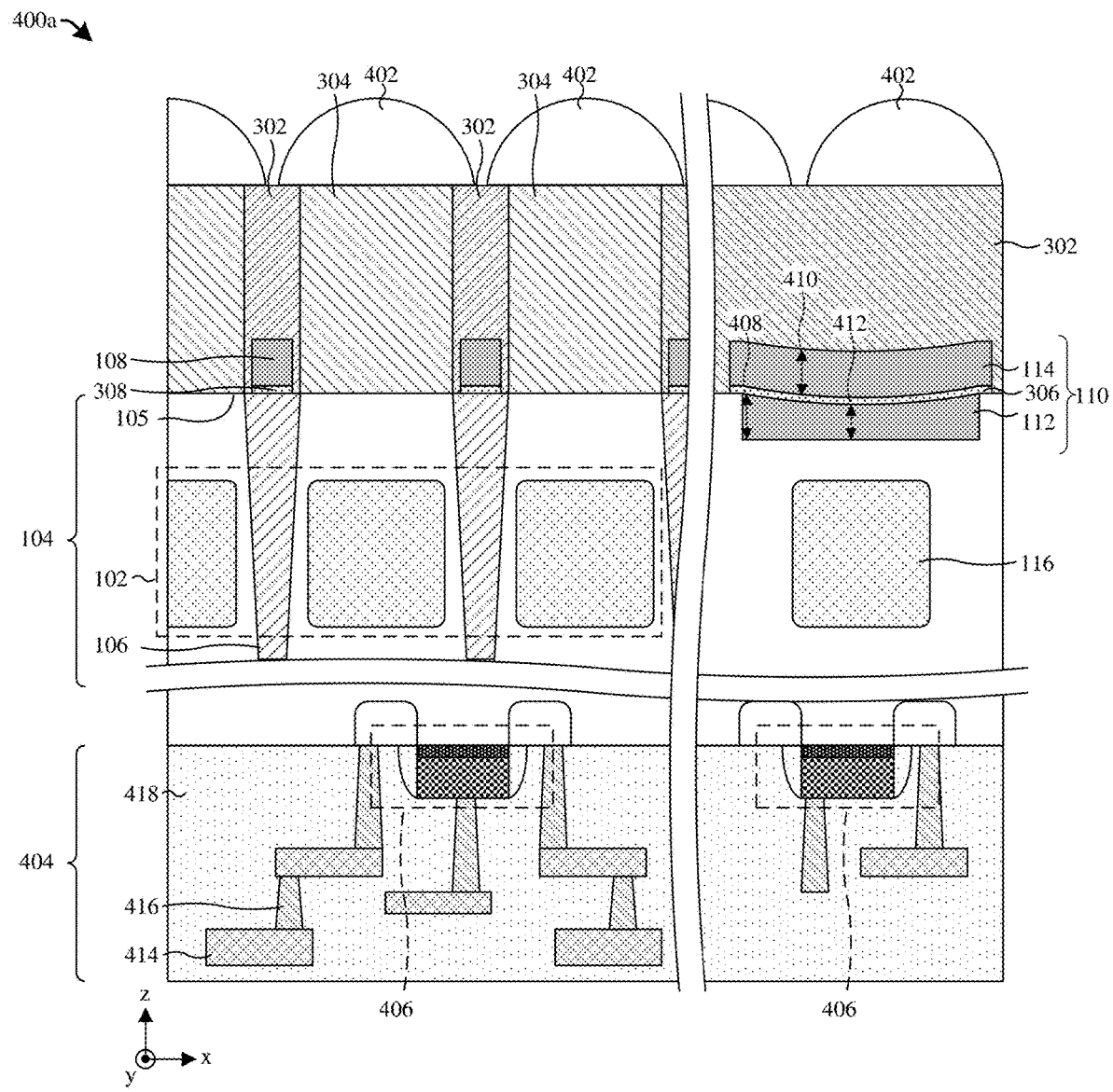
FIGS. 4A-4D illustrates cross-sectional views of some other embodiments of the image sensor illustrated in FIGS. 1A-1B.

As shown in the cross-sectional view 400a of FIG. 4A, the image sensor further comprises the dielectric structure 302, the light filters 304, and the first and second etch stop layers 306, 308 as described with regard to FIGS. 3A-3B. Further, a plurality of micro lenses 402 are disposed on top of the plurality of light filters 304 and the dielectric structure 302. The plurality of micro lenses 402 have micro lenses at the central region 101a, and each micro lens at the central region 101a is centered on a corresponding light filter of the plurality of light filters 304. Further, the plurality of micro lenses 402 have micro lenses overlying the recessed blocking structure 110 at the peripheral region 101b. In alternative embodiments, the micro lenses overlying the recessed blocking structure 110 at the peripheral region 101b are omitted.

A top surface of the first blocking layer 112 has a concave surface facing the second blocking layer 114. This causes a similar curvature to propagate into the first etch stop layer 306 and the second blocking layer 114. The curvature at the top surface of the first blocking layer 112 may, for example, be due to a chemical mechanical polishing (CMP) process used while forming the first blocking layer 112. In some embodiments, the first blocking layer 112 has a central portion and a peripheral portion. The peripheral portion has a first thickness 408 that is substantially equal to the thickness 410 of the second blocking layer 114, and the central portion has a second thickness 412 that is less than the thickness 410 of the second blocking layer 114. In some embodiments, the top surface of the recessed blocking structure 110 has top edges elevated relative to a center of the top surface of the blocking recessed blocking structure 110.

A plurality of pixel transistors 406 and an interconnect structure 404 underlie the semiconductor substrate 104 on a second side of the semiconductor substrate 104, opposite the first side 105 of the semiconductor substrate 104. The pixel transistors 406 are between the semiconductor substrate 104 and the interconnect structure 404. Further, the pixel transistors 406 are individual to the active and BLC photodetectors 102, 116 and facilitate readout of the active and BLC photodetectors 102, 116.

The interconnect structure 404 covers and electrically couples to the pixel transistors 406 on the second side of the semiconductor substrate 104. Further, the interconnect structure 404 comprises a plurality of wires 414 and a plurality of vias 416 in an interconnect dielectric structure 418. The wires 414 and the vias 416 are respectively grouped in a plurality of wire levels and a plurality of via levels that are alternatingly stacked to define conductive paths leading from the pixel transistors 406.

Figure 4B:
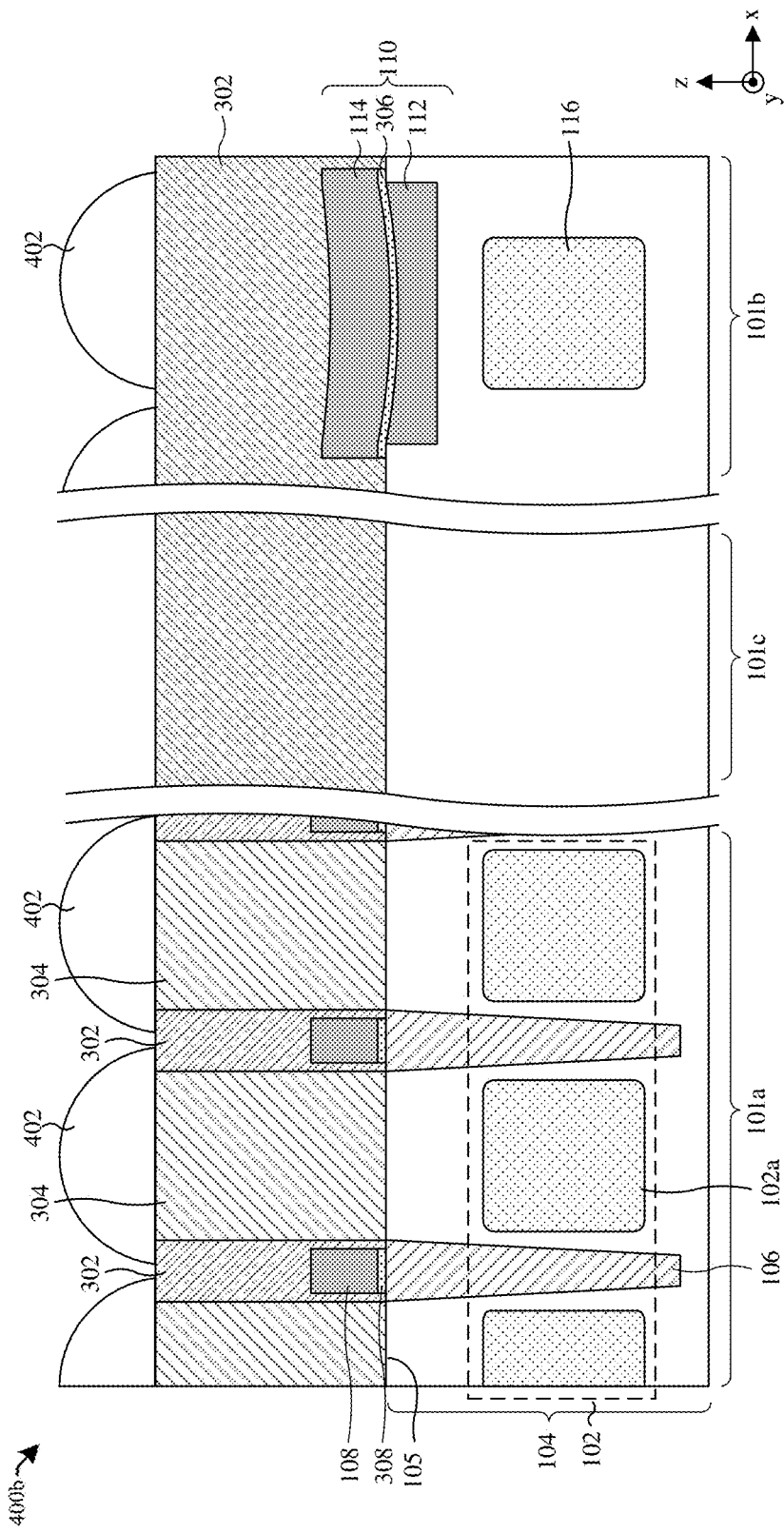

As shown in the cross-sectional view 400b of FIG. 4B, the image sensor is as in FIG. 4A, except that the interconnect structure 404 and the pixel transistors 406 are not shown and a gap region 101c is between the central region 101a and the peripheral region 101b. In some embodiments, the plurality of light filters 304 and the isolation structures 106 do not extend into the gap region 101c. As described above, because the recessed blocking structure 110 is recessed into the semiconductor substrate 104, topographical variation is low at the peripheral region 101b. This allows the gap region 101c to be small or omitted. On the other hand, if topographical variation were high at the peripheral region 101b, the gap region 101c may be large to provide a buffer for the topographical variation. Hence, surface area may be wasted.

Figure 4C:
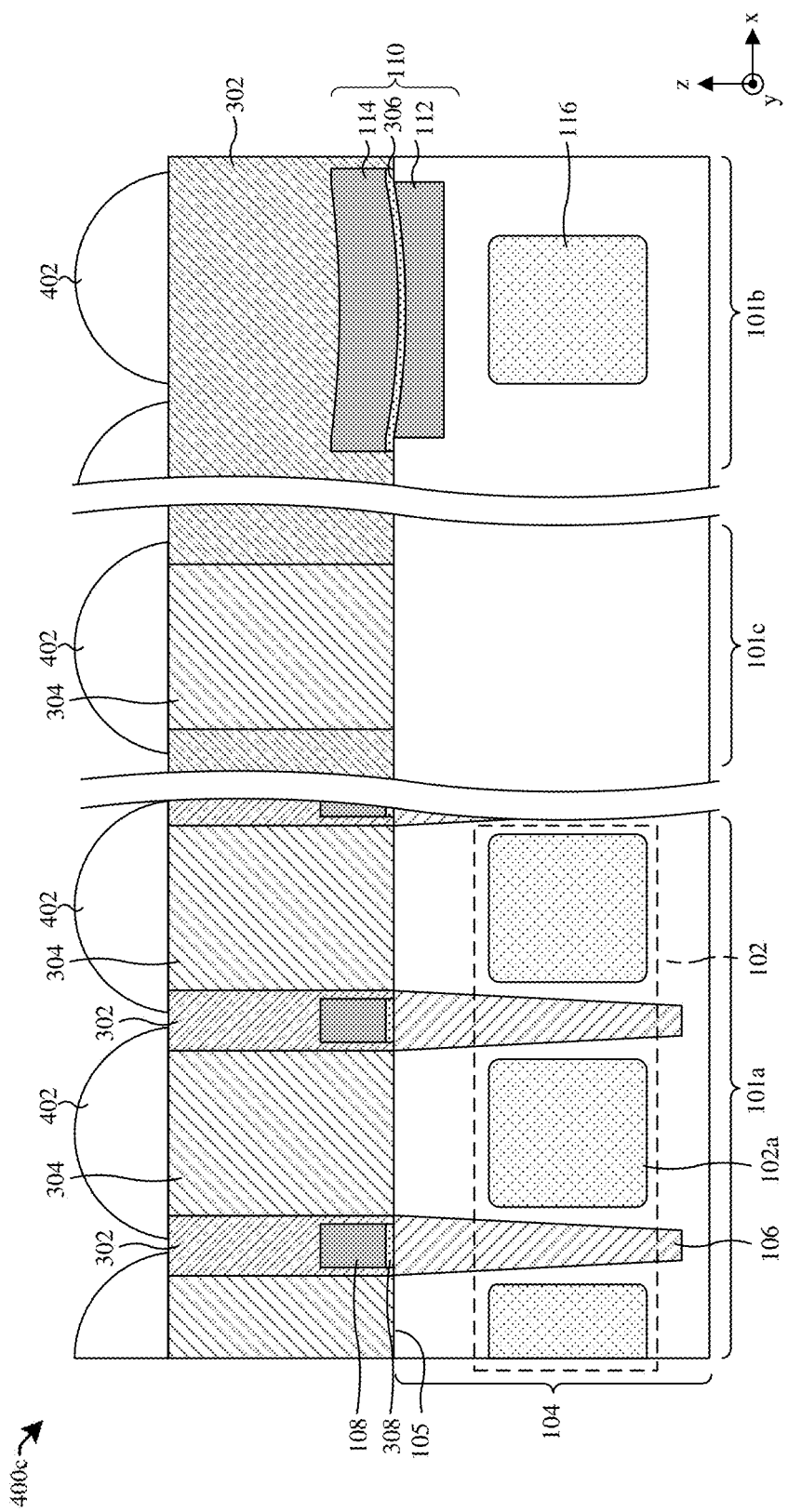

As shown in the cross-sectional view 400c of FIG. 4C, the image sensor is as in FIG. 4B, except that the gap region 101c contains light filters of the plurality of light filters 304 and micro lenses of the plurality of micro lenses 402. More generally, the gap region 101c may contain any combination of features from the central region 101a, except for the plurality of active photodetectors 102 and the metal grid structure 108.

Figure 4D:
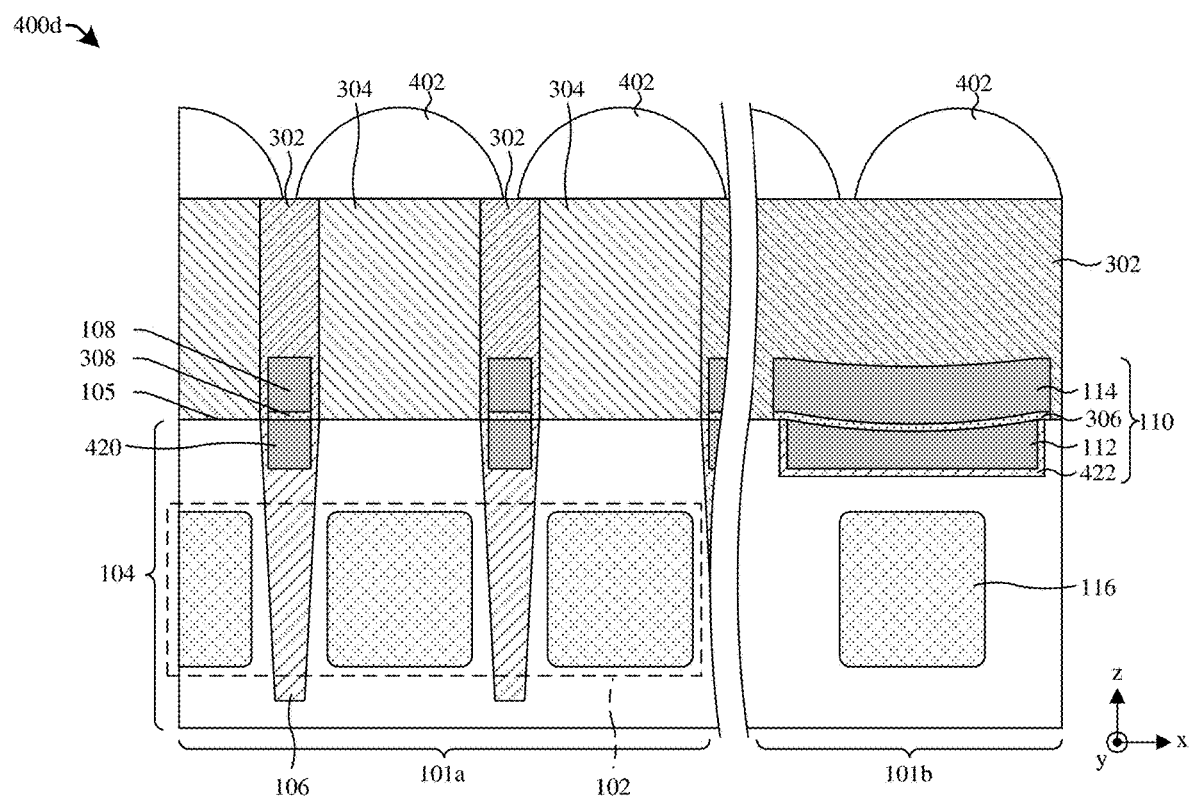

As shown in the cross-sectional view 400d of FIG. 4D, the image sensor is as in FIG. 4A with a few exceptions hereafter described. An additional metal grid structure 420 is recessed into the isolation structure 106 on the first side 105 of the semiconductor substrate 104. In some embodiments, the additional metal grid structure 420 is confined by the outer sidewalls of the metal grid structure 108 and is directly beneath the metal grid structure 108. In other embodiments, either one or both of the metal grid structure 108 and the additional metal grid structure 420 may be present in the image sensor.

Beyond the additional metal grid structure 420, a dielectric layer 422 separates the first blocking layer 112 and hence the recessed blocking structure 110 from the semiconductor substrate 104. The dielectric layer 422 prevents the first blocking layer 112 from directly contacting the semiconductor substrate 104. Direct contact between a semiconductor substrate 104 and the first blocking layer may cause some metals and materials to diffuse into the semiconductor substrate 104, degrading the performance of the recessed blocking structure 110 and/or semiconductor devices in the semiconductor substrate 104.

Figure 5A:
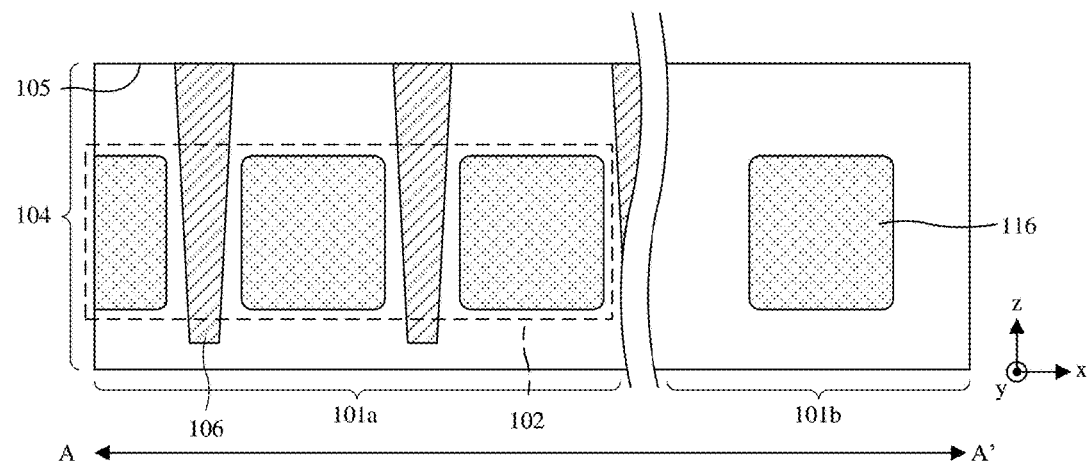
FIG. 5A through FIG. 13 illustrate a series of views of some embodiments of a method for forming an image sensor having a recessed blocking structure.
Figure 5B:
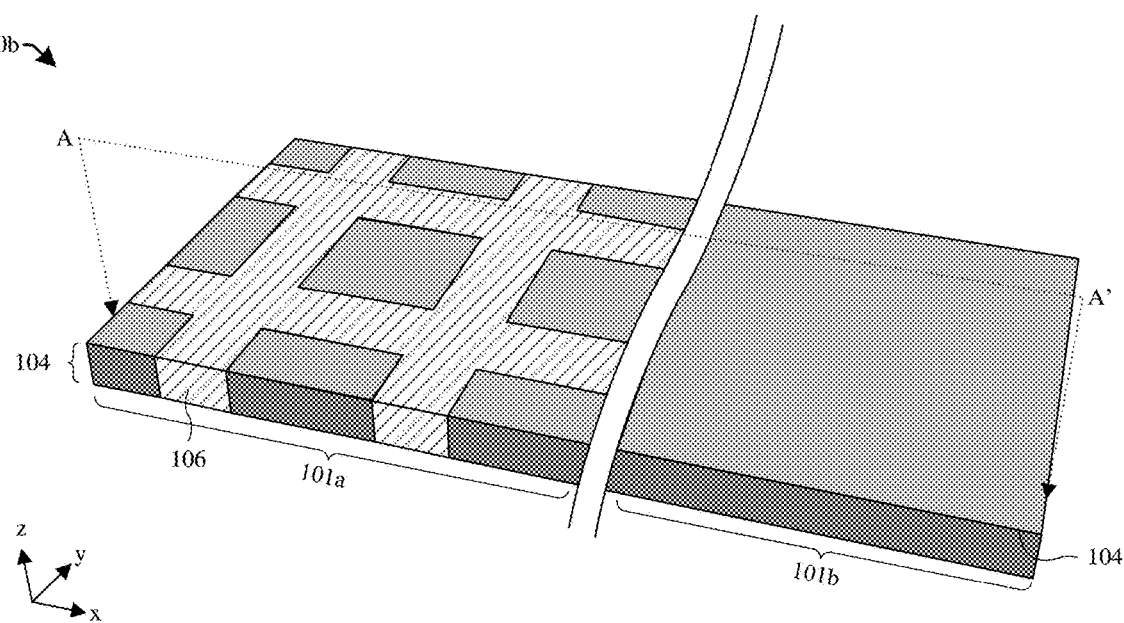
Figure 12A:
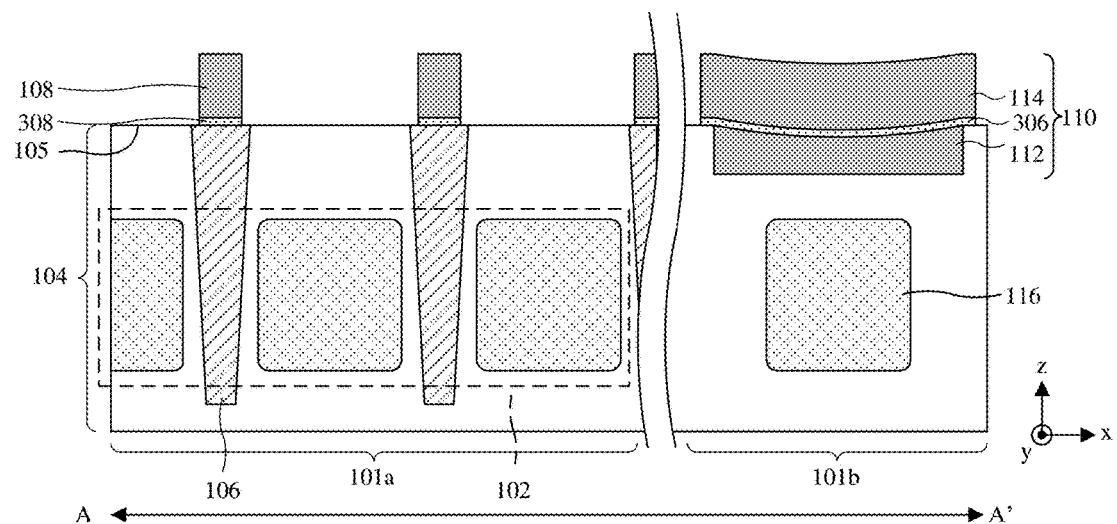
Figure 12B:
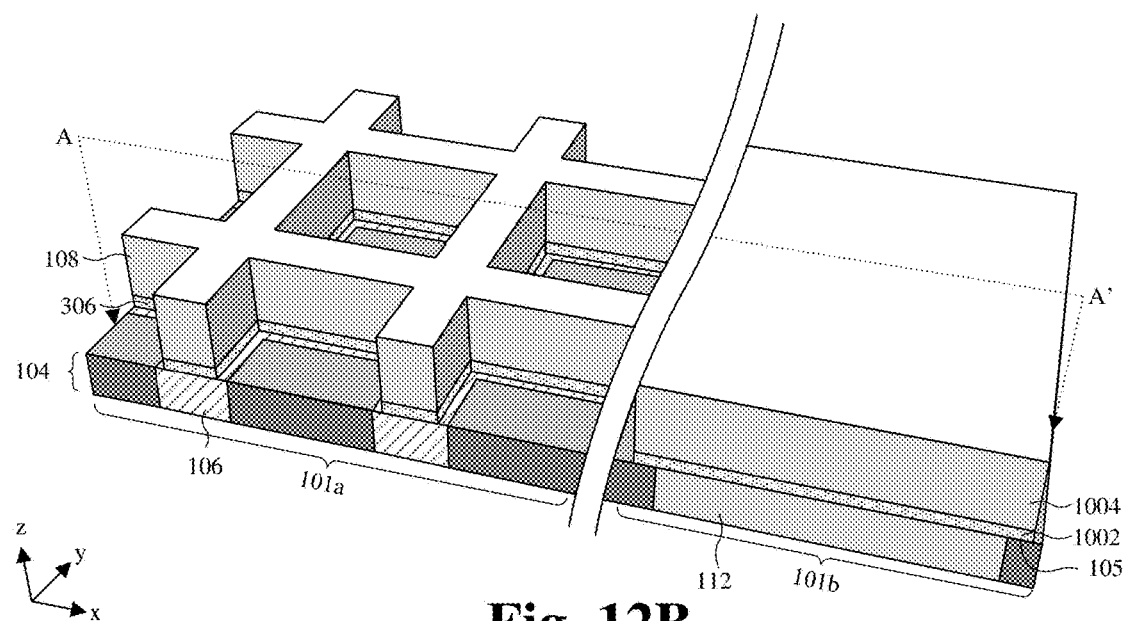
Figure 13:
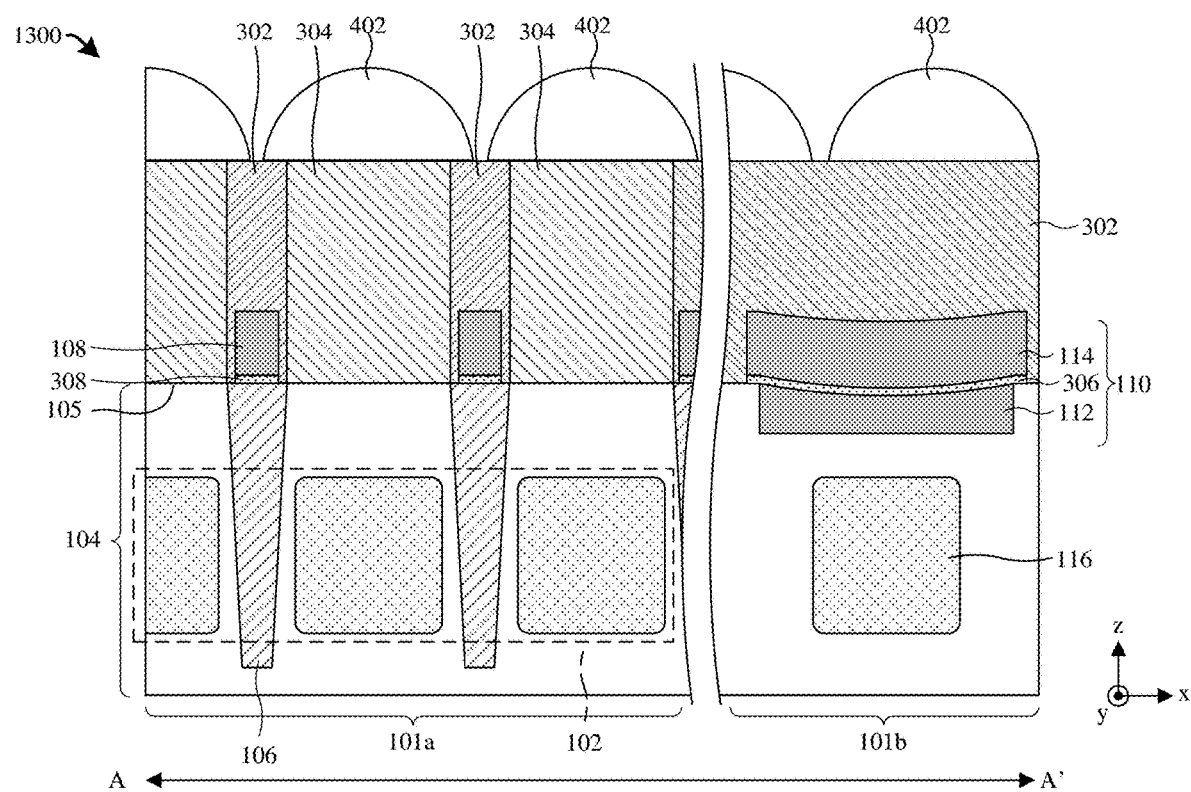

FIGS. 5A-5B through FIG. 13 illustrate a series of views of some embodiments of a method for forming an image sensor having a blocking structure. Figures with a suffix of "B" (e.g., FIG. 5B-12B) illustrate perspective views 500b-1200b. Figures with a suffix of "A" (e.g., FIG. 5A-12A) illustrate cross-sectional views 500a-1200a and are taken along line A-A' in like numbered figures with a suffix of "B". FIG. 13 illustrates a cross-sectional view 1300 that continues the series and is taken along the line A-A' in FIG. 12B. Although FIGS. 5A-5B through 13 are described with reference to a method, it will be appreciated that the structures shown in FIGS. 5A-5B through 13 are not limited to the method but rather may stand alone separate of the method.

As shown in the cross-sectional view 500a of FIG. 5A and the perspective view 500b of FIG. 5B, a semiconductor substrate 104 is provided. A plurality of photodetectors are formed in the semiconductor substrate 104. The plurality of photodetectors comprise a plurality of active photodetectors 102 at a central region 101a of the image sensor, and further comprise a BLC photodetector 116 at a peripheral region 101b of the image sensor. In some embodiments, an isolation structure 106 is disposed within the semiconductor substrate 104 to separate the active and BLC photodetectors 102, 116 from each other. For example, the isolation structure 106 may extend into a first side 105 of the semiconductor substrate 104. It will be appreciated that the plurality of photodetectors and the isolation structure 106 may be formed in the semiconductor substrate 104 by complementary metal-oxide-semiconductor (CMOS) processes.

Figure 6A:
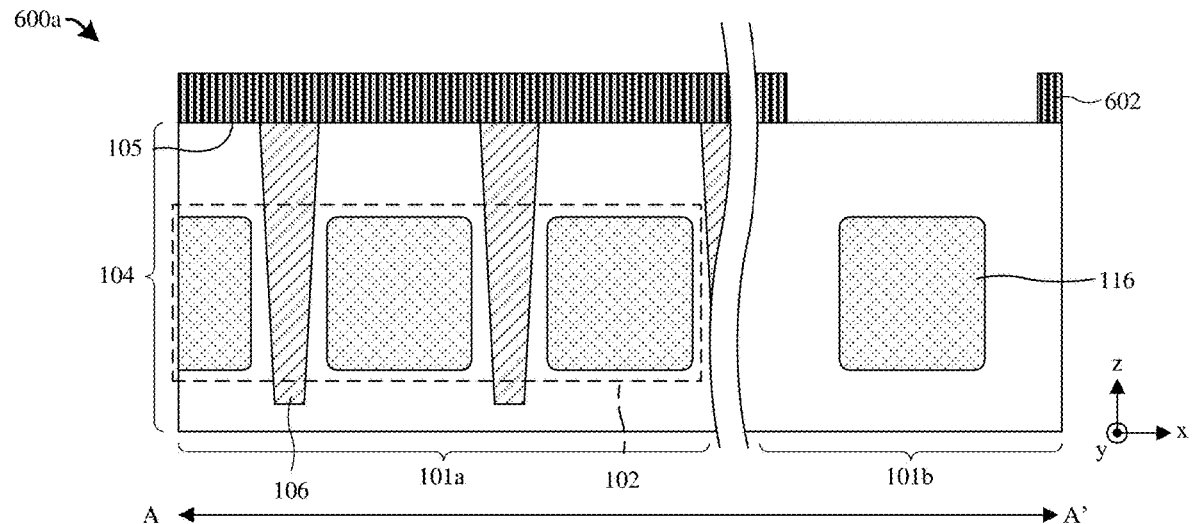
Figure 6B:
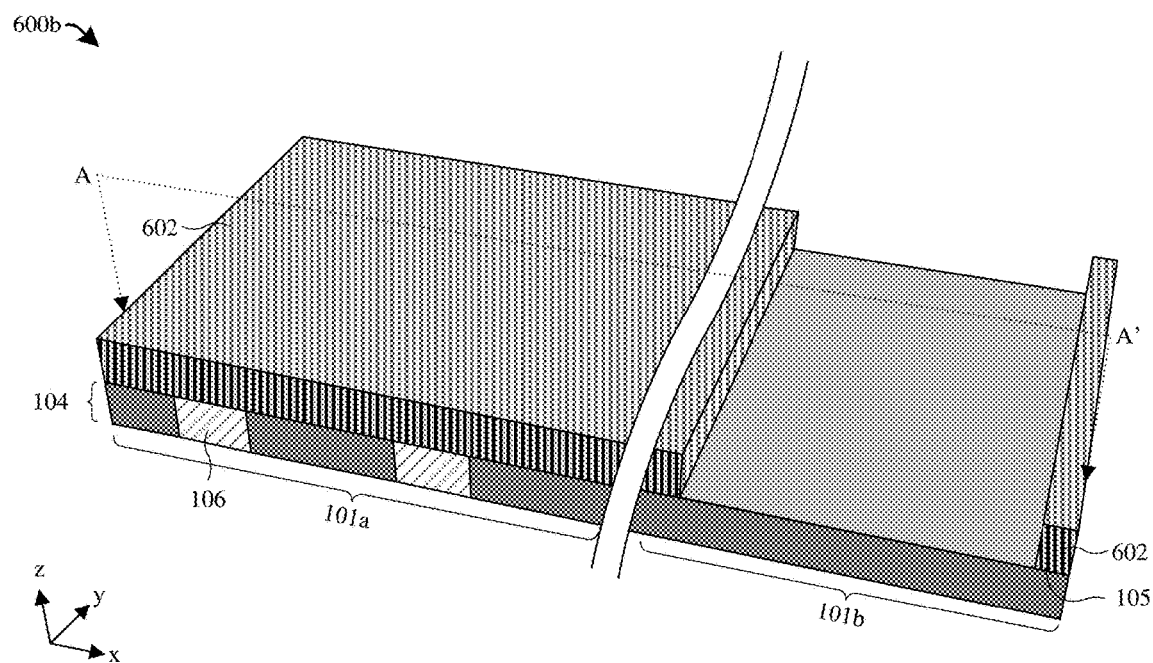

As shown in the cross-sectional view 600a of FIG. 6A and the perspective view 600b of FIG. 6B, a first mask 602 is formed on the first side 105 of the semiconductor substrate 104. The first mask 602 may be formed by forming a masking layer (not shown) on the first side 105 (e.g., via a spin-on process), exposing the masking layer to a pattern (e.g., via a lithography process, such as photolithography, extreme ultraviolet lithography, or the like), and developing the masking layer, thereby forming the first mask 602 on the first side 105 of the semiconductor substrate 104.

Figure 7A:
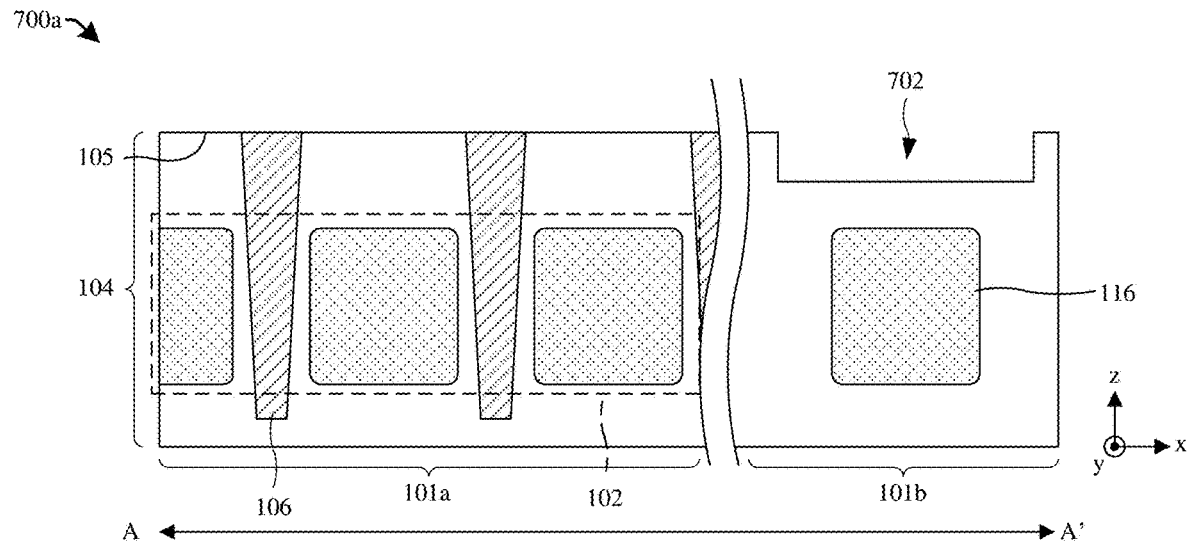
Figure 7B:
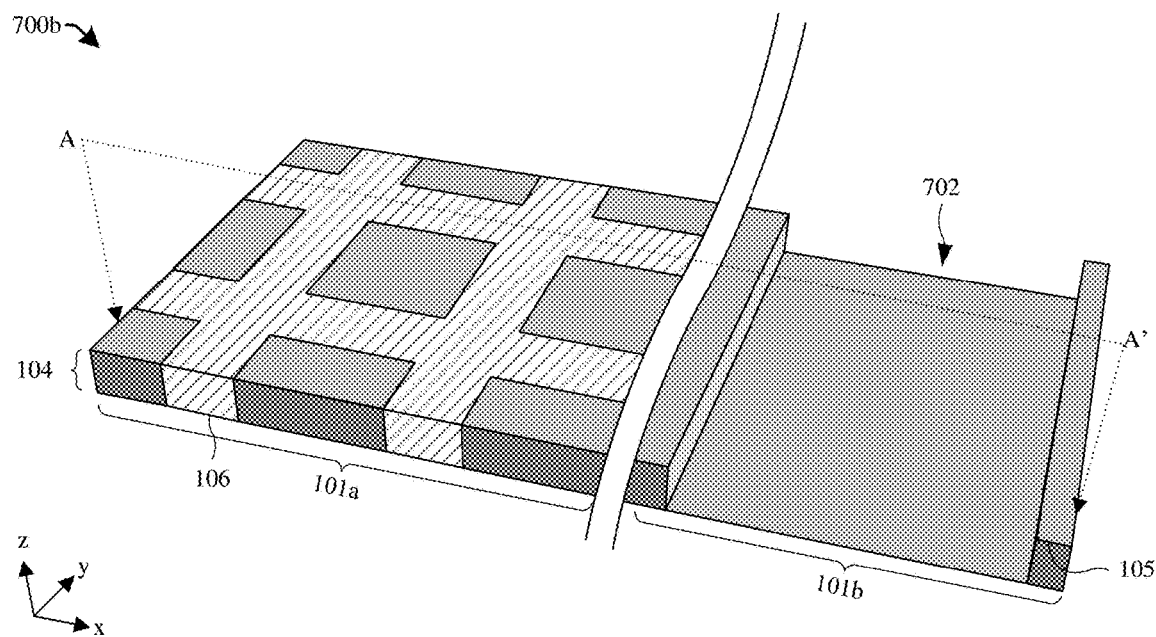

As shown in the cross-sectional view 700a of FIG. 7A and the perspective view 700b of FIG. 7B, a recess 702 is formed in the first side 105 of the semiconductor substrate 104. In some embodiments, to form the recess 702, a first etching process (e.g., anisotropic etching process) is performed on the first side 105 to selectively etch the semiconductor substrate 104 according to the first mask 602 (see, e.g., FIGS. 6A-6B). The first etching process removes unmasked portions of the semiconductor substrate 104, thereby forming the recess 702. In some embodiments, the first etching process may be, for example, a dry etching process, a reactive ion etching (RIE) process, a wet etching process, some other suitable etching process, or a combination of the foregoing. In further embodiments, the first etching process is a dry etching process (or a RIE process) that has a fluorine-based etch chemistry (e.g., carbon tetrafluoride ($CF_4$)/argon (Ar), or the like). In some embodiments, the first mask 602 is stripped away after the first etching process.

Figure 8A:
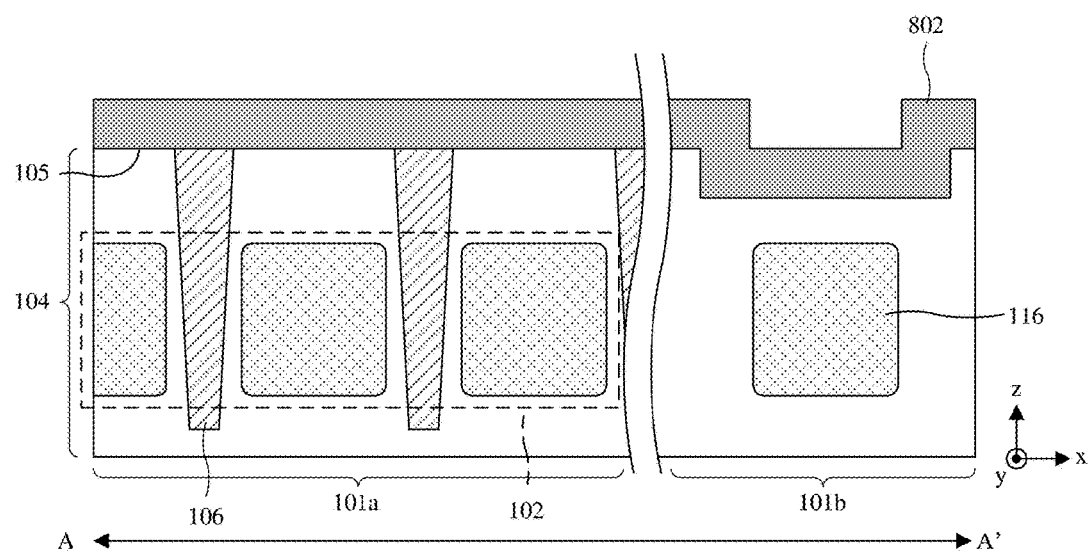
Figure 8B:
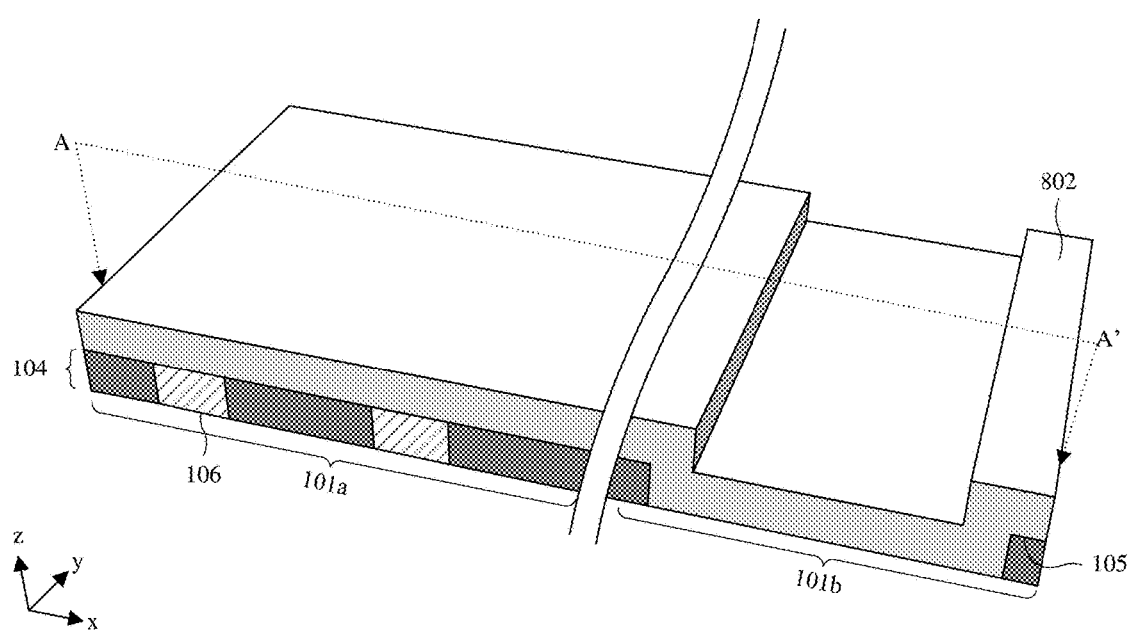

As shown in the cross-sectional view 800a of FIG. 8A and the perspective view 800b of FIG. 8B, a first metal layer 802 is formed over the first side 105 of the semiconductor substrate 104 and within the recess 702 (see, e.g., FIGS. 7A-7B). In some embodiments, a process for forming the first metal layer 802 comprises depositing the first metal layer 802 covering the first side 105 and filling the recess 702. The first metal layer 802 may be deposited by, for example, chemical vapor deposition (CVD), physical vapor deposition (PVD), atomic layer deposition (ALD), sputtering, electrochemical plating, electroless plating, some other deposition process, or a combination of the foregoing. In some embodiments, the first metal layer 802 is deposited with a thickness of about 500-1500 Å, about 500-1000 Å, or about 1000-1500 Å. Other suitable thickness values are, however, amenable in alternative embodiments.

Figure 9A:
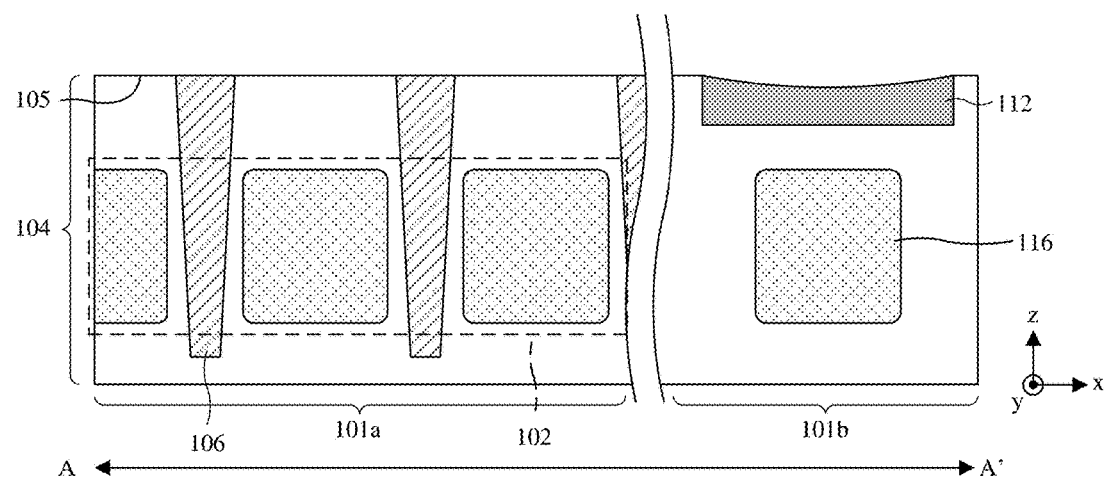
Figure 9B:
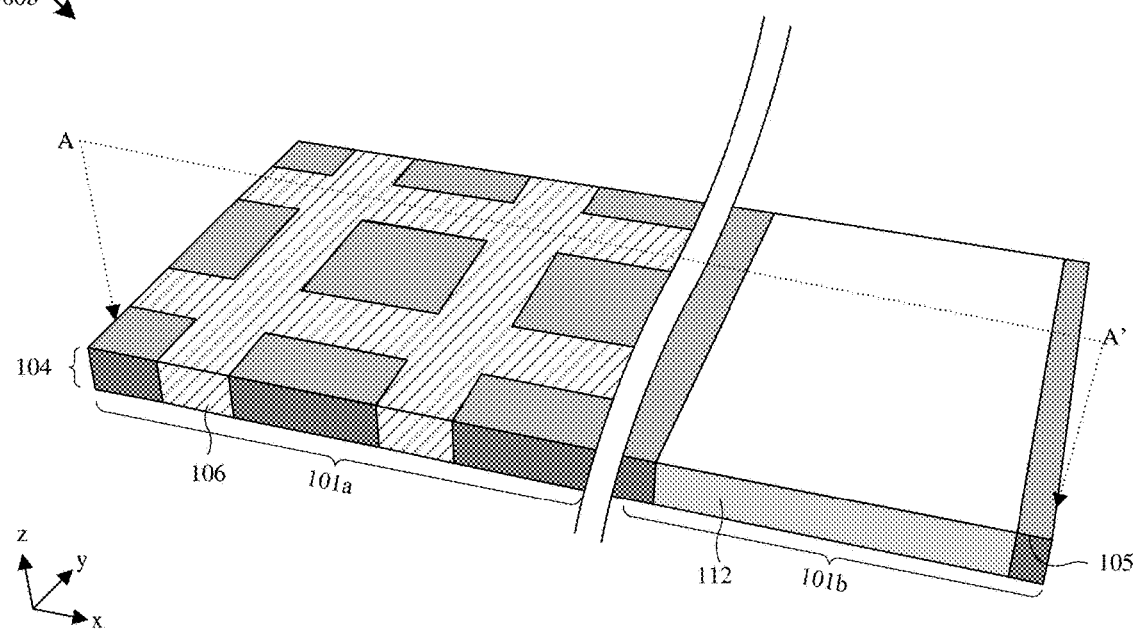

As shown in the cross-sectional view 900a of FIG. 9A and the perspective view 900b of FIG. 9B, a planarization process (e.g., a CMP process) is performed on the first metal layer 802. Over the course of this process, portions of the first metal layer 802 atop the first side 105 of the semiconductor substrate 104 are removed to form a first blocking layer 112 in the recess 702 (see, e.g., FIGS. 7A-7B). The CMP process also removes a portion of the first metal layer 802 within the recess 702, thereby forming a concave surface on the first blocking layer 112.

Figure 10A:
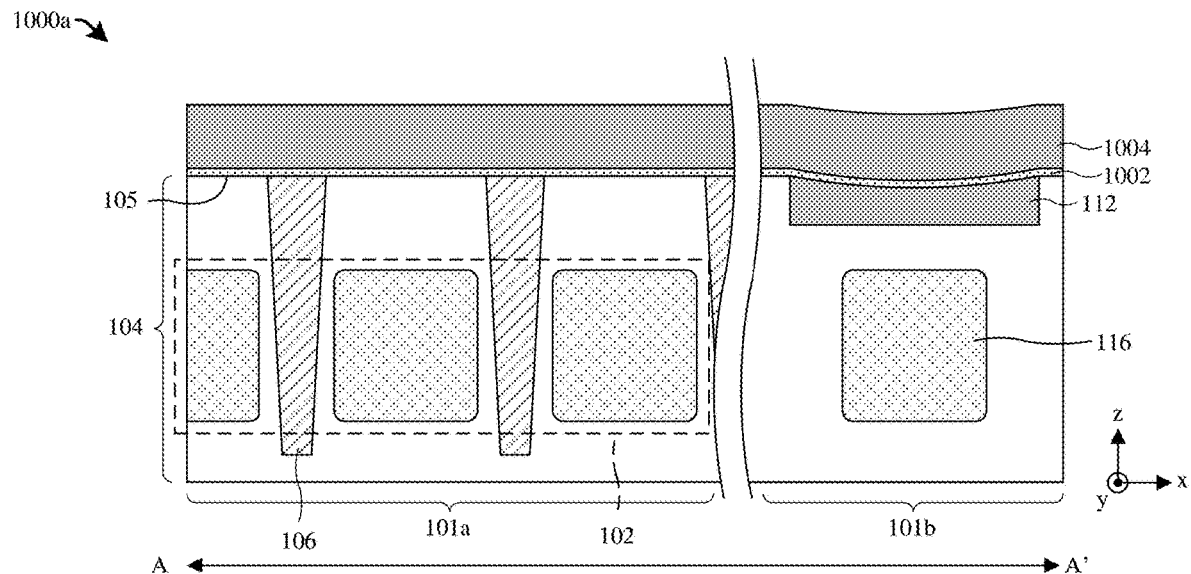
Figure 10B:
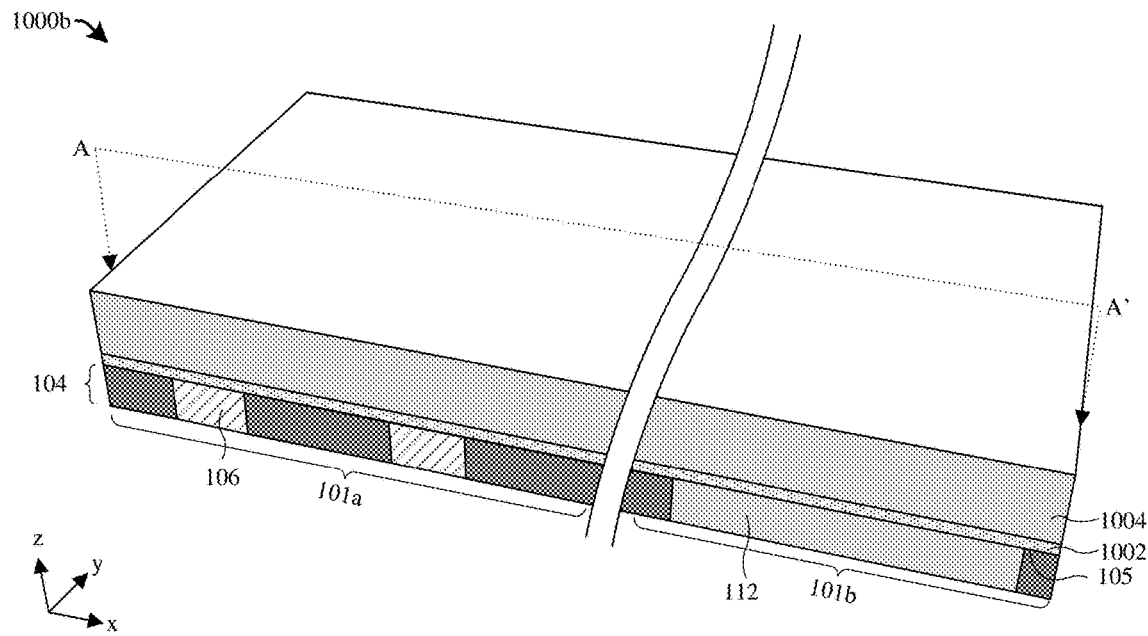

As shown in the cross-sectional view 1000a of FIG. 10A and the perspective view 1000b of FIG. 10B, an etch stop layer 1002 is formed over the first side 105 of the semiconductor substrate 104 and the first blocking layer 112. In some embodiments, a process for forming the etch stop layer 1002 comprises depositing the etch stop layer 1002 conformally on the semiconductor substrate 104 and the isolation structure 106. The etch stop layer 1002 may be deposited by, for example, CVD, PVD, ALD, some other deposition process, or a combination of the foregoing. The etch stop layer 1002 may be or comprise, for example, an oxide (e.g., $SiO_2$), a nitride (e.g., SiN), an oxynitride (e.g., $SiO_xN_y$), a metal nitride (e.g., tantalum nitride (TaN), titanium nitride (TiN), etc.), some other suitable etch stop material, or a combination of the foregoing. In some embodiments, the etch stop layer 1002 is deposited with a thickness of about 50-300 Å, about 50-175 Å, about 175-300 Å, about 20-200 Å, about 20-110 Å, or about 110-200 Å. Other suitable thickness values are, however, amenable.

Also shown in the cross-sectional view 1000a of FIG. 10A and the perspective view 1000b of FIG. 10B is a second metal layer 1004 formed over the etch stop layer 1002. In some embodiments, a process for forming the second metal layer 1004 comprises depositing the second metal layer 1004 covering the first side 105 of the semiconductor substrate 104 and the first blocking layer 112 over the etch stop layer 1002. The second metal layer 1004 may be deposited by, for example, CVD, PVD, ALD, sputtering, electrochemical plating, electroless plating, some other deposition process, or a combination of the foregoing. In some embodiments, the second metal layer 1004 is deposited with a thickness of about 500-1500 Å, about 500-1000 Å, or about 1000-1500 Å. Other suitable thickness values are, however, amenable. In some embodiments, a combined thickness of the first blocking layer 112 and the second metal layer 1004 is at least 2000 Å or some other suitable value. In some embodiments, the second metal layer 1004 has the same or substantially the same thickness as the first blocking layer 112.

Figure 11A:
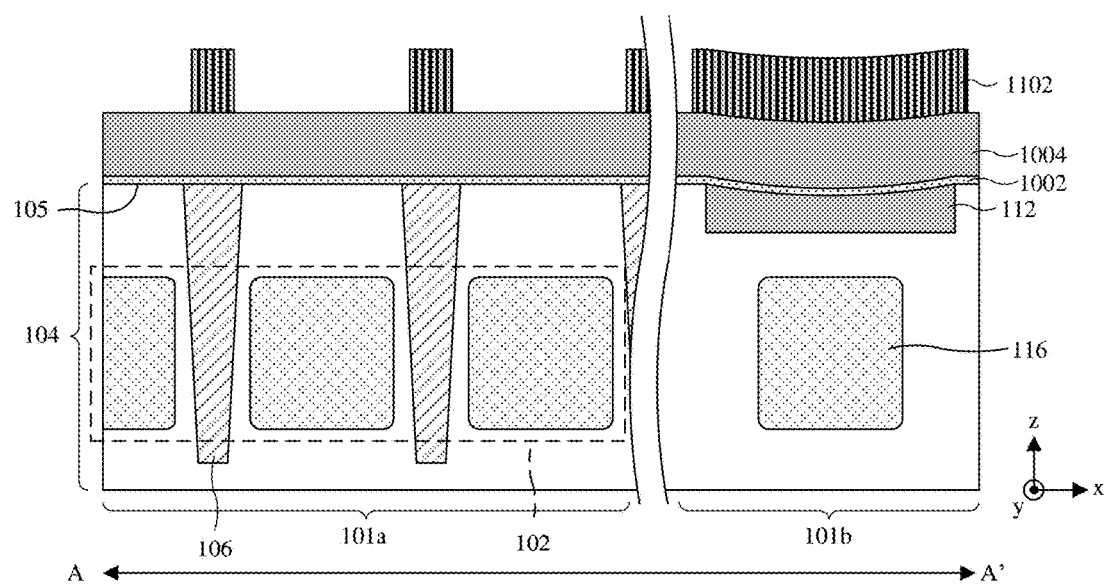
Figure 11B:
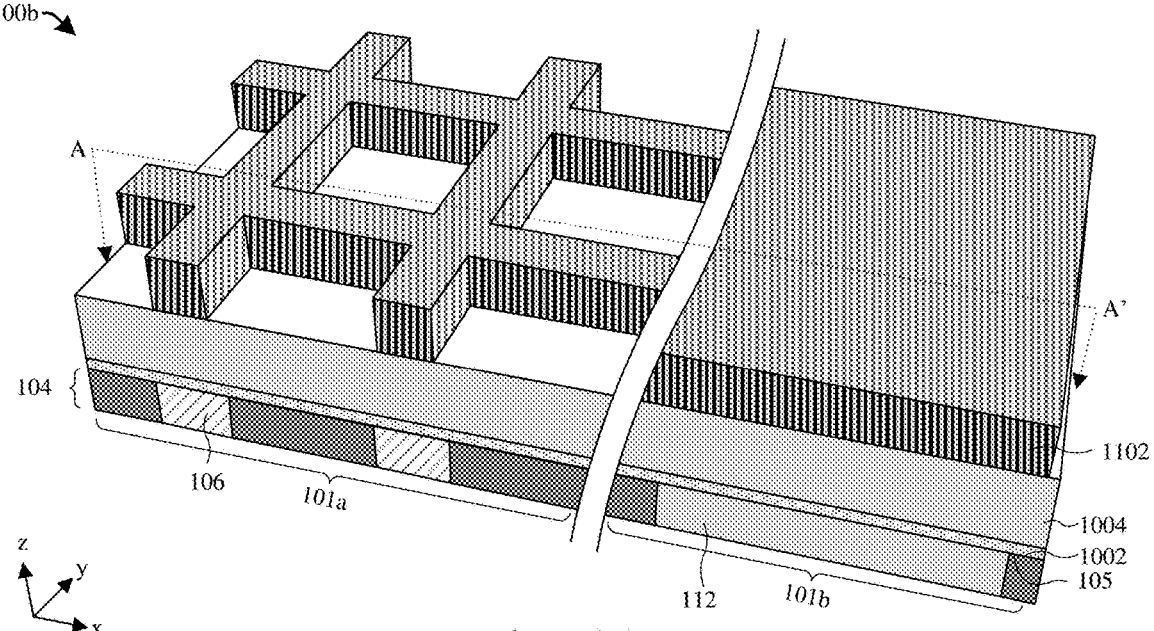

As shown in the cross-sectional view 1100a of FIG. 11A and the perspective view 1100b of FIG. 11B, a second mask 1102 is formed over the second metal layer 1004. The second mask 1102 may be formed by forming a masking layer (not shown) on the first side 105 of the semiconductor substrate 104 (e.g., via a spin-on process), exposing the masking layer to a pattern (e.g., via a lithography process, such as photolithography, extreme ultraviolet lithography, or the like), and developing the masking layer, thereby forming the second mask 1102 over the second metal layer 1004. Due to the substantially flat top surface of the second metal layer 1004 (e.g., low topographical variation across the top surface of the second metal layer 1004), the exposing and the developing are performed with high uniformity. This results in formation of the second mask 1102 with high uniformity and may enhance performance of the image sensor.

As shown in the cross-sectional view 1200a of FIG. 12A and the perspective view 1200b of FIG. 12B, the second metal layer 1004 (see, e.g., FIGS. 11A-11B) and the etch stop layer 1002 (see, e.g., FIGS. 11A-11B) are patterned according to second mask 1102 to form a first etch stop layer 306, a second etch stop layer 308, a metal grid structure 108, and a second blocking layer 114 on the first side 105 of the semiconductor substrate 104. In some embodiments, the second mask 1102 is stripped away after the third etching process.

To form the metal grid structure 108 and the second blocking layer 114, a second etching process (e.g., anisotropic etching process) is performed into the second metal layer 1004 to pattern the second metal layer 1004 according to the second mask 1102. In some embodiments, the second etching process additionally patterns the etch stop layer 1002 according to the second mask 1102 in order to form the first etch stop layer 306 and the second etch stop layer 308. The second etching process removes portions of the second metal layer 1004 unmasked by the second mask 1102, thereby forming the metal grid structure 108 and the second blocking layer 114. The metal grid structure 108 individually surrounds the plurality of active photodetectors 102 along peripheries of the plurality of active photodetectors. The second blocking layer 114 overlying the first blocking layer 112 to form a recessed blocking structure 110 with the first blocking layer 112. In some embodiments, the second etching process may be, for example, a dry etching process, a reactive ion etching (RIE) process, a wet etching process, some other etching process, or a combination of the foregoing. In further embodiments, the second etching process is a dry etching process (or a RIE process) that has a fluorine-based etch chemistry (e.g., nitrogen trifluoride ($NF_3$)/argon (Ar), or the like).

The second etching process forms the second blocking layer 114 with a high degree of thickness uniformity (e.g., without voids) because the second mask 1102 provides a high degree of protection. The high degree of protection follows from the high degree of uniformity of the second mask 112 has, as described above. Similarly, for the same reasons, the second etching process also causes less variation in the metal grid structure 108. As such, performance of the active and BLC photodetectors 102, 116 may be enhanced.

In some embodiments, the second etching process stops on the etch stop layer 1002 before etching through the etch stop layer 1002. In at least some of such embodiments, a third etching process (e.g., anisotropic etching process) is performed on the etch stop layer 1002 to selectively etch the etch stop layer 1002 according to the second mask 1102. The third etching process removes unmasked portions of the etch stop layer 1002, thereby forming the first etch stop layer 306 and the second etch stop layer 308. In some embodiments, the third etching process may be, for example, a dry etching process, a RIE process, a wet etching process, some other etching process, or a combination of the foregoing. In further embodiments, the third etching process is a dry etching process (or a RIE process) that has a fluorine-based etch chemistry (e.g., carbon tetrafluoride ($CF_4$), trifluoromethane ($CHF_3$), octafluorocyclobutane ($C_4F_8$), or the like).

As shown in cross-sectional view 1300 of FIG. 13, the dielectric structure 302, plurality of light filters 304, and the plurality of micro lenses 402 are formed over the semiconductor substrate 104.

Figure 14:
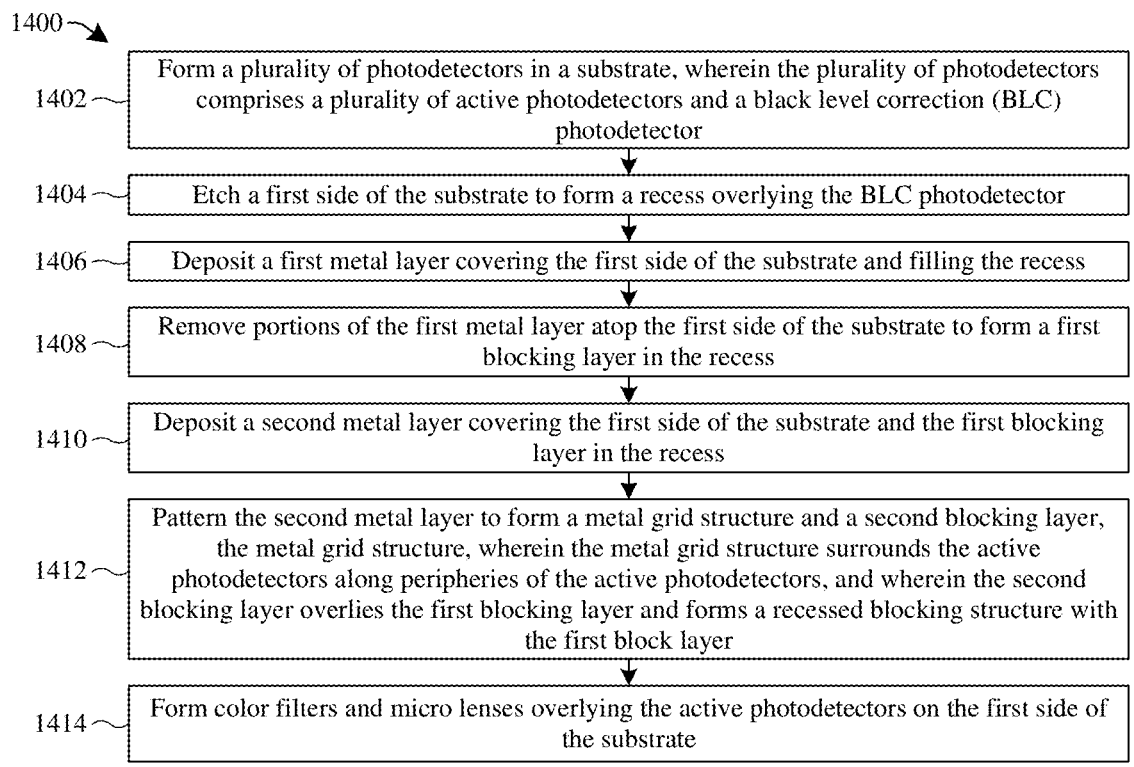
FIG. 14 illustrates a flowchart of some embodiments of a method for forming an image sensor having a recessed blocking structure.

FIG. 14 illustrates a flowchart 1400 of some embodiments of a method for forming an image sensor having a blocking structure with a recessed profile. While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1402, a plurality of photodetectors is formed in a substrate, wherein the plurality of photodetectors comprises a plurality of active photodetectors and a BLC photodetector. FIGS. 5A-5B illustrate various views 500a-500b of some embodiments corresponding to act 1402.

At act 1404, a first side of the substrate is etched to form a recess overlying the BLC photodetector. FIGS. 6A-7B illustrate various views 600a-700b of some embodiments corresponding to act 1404.

At act 1406, a first metal layer is deposited covering the first side of the substrate and filling the recess. FIGS. 8A-8B illustrate various views 800a-800b of some embodiments corresponding to act 1406.

At act 1408, portions of the first metal layer atop the first side of the substrate are removed to form a first blocking layer in the recess. FIGS. 9A-9B illustrate various views 900a-900b of some embodiments corresponding to act 1408.

At act 1410, a second metal layer is deposited, covering the first side of the substrate and the first blocking layer in the recess. FIGS. 10A-10B illustrate various views 1000a-1000b of some embodiments corresponding to act 1410.

At act 1412, the second metal layer is patterned to form a metal grid structure and a second blocking layer, wherein the metal grid structure surrounds the active photodetectors along peripheries of the active photodetectors, and wherein the second blocking layer overlies the first blocking layer and forms a recessed blocking structure with the first block layer. FIGS. 11A-12B illustrate various views 1100a-1100b of some embodiments corresponding to act 1412.

At act 1414, color filters and micro lenses are formed overlying the active photodetectors on the first side of the substrate. FIG. 13 illustrates a cross-sectional view 1300 of some embodiments corresponding to act 1414.

In some embodiments, the present disclosure provides an image sensor, including: a substrate; a plurality of photodetectors disposed within the substrate and including a first active photodetector and a BLC photodetector; a metal grid structure surrounding the first active photodetector, along a periphery of the first active photodetector, on a first side of the substrate; and a blocking structure covering the BLC photodetector on the first side of the substrate, wherein the blocking structure includes: 1) a first blocking layer inset into the first side of the substrate; and 2) a second blocking layer directly over the first blocking layer.

In some embodiments, the present disclosure provides another image sensor, including: a substrate; a plurality of photodetectors disposed within the substrate and including a plurality of active photodetectors and a BLC photodetector; a metal grid structure disposed over the substrate on a first side of the substrate, wherein the metal grid structure individually surrounds the active photodetectors along peripheries of the active photodetectors; and a blocking structure covering the BLC photodetector on the first side of the substrate, wherein the blocking structure has a top surface level with a top surface of the metal grid structure and further has a thickness greater than a thickness of the metal grid structure.

In some embodiments, the present disclosure provides a method of forming a semiconductor device, including: forming a plurality of photodetectors in a substrate, wherein the plurality of photodetectors includes a plurality of active photodetectors and a BLC photodetector; etching a first side of the substrate to form a recess overlying the BLC photodetector; depositing a first metal layer covering the first side of the substrate and filling the recess; removing portions of the first metal layer atop the first side of the substrate to form a first blocking layer in the recess; depositing a second metal layer covering the first side of the substrate and the first blocking layer in the recess; and patterning the second metal layer to form a metal grid structure and a second blocking layer, the metal grid structure surrounding the active photodetectors along peripheries of the active photodetectors, and the second blocking layer overlying the first blocking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a plurality of photodetectors in a substrate, wherein the plurality of photodetectors comprises a plurality of active photodetectors and a black level correction (BLC) photodetector;
   etching a first side of the substrate to form a recess overlying the BLC photodetector;
   depositing a first metal layer covering the first side of the substrate and filling the recess;
   removing portions of the first metal layer atop the first side of the substrate to form a first blocking layer in the recess;
   depositing a second metal layer covering the first side of the substrate and the first blocking layer in the recess; and
   patterning the second metal layer to form a metal grid structure and a second blocking layer, the metal grid structure surrounding the active photodetectors along peripheries of the active photodetectors, and the second blocking layer overlying the first blocking layer.

2. The method of claim 1, wherein the first and second metal layers are formed with substantially the same thickness.

3. The method of claim 1, wherein the removing comprises chemical mechanical polishing into the first metal layer.

4. The method of claim 1, wherein the patterning forms a plurality of openings separated from each other by the metal grid structure, wherein the openings are individual to and respectively overlie the active photodetectors.

5. The method of claim 1, further comprising:
   forming a first mask over the first side of the substrate before the etching, wherein the recess is etched according to the first mask; and
   wherein the patterning comprises forming a second mask over the second metal layer and subsequently etching the second metal layer according to the second mask.

6. A method of forming an integrated device, comprising:
   forming a plurality of photodetectors in a substrate, wherein the plurality of photodetectors comprises a first plurality of active photodetectors and a first photodetector spaced from the first plurality of active photodetectors;
   forming a first metal layer extending into a first side of the substrate, the first metal layer having a lowermost surface extending directly over the first photodetector and being laterally spaced from the first plurality of active photodetectors;
   performing a planarization process to remove portions of the first metal layer that extend above the first side of the substrate, resulting in a first blocking layer remaining in the substrate;

depositing a second metal layer on the first side of the substrate over the first blocking layer and the first plurality of active photodetectors; and patterning the second metal layer to form a metal grid structure and a second blocking layer, the metal grid structure comprising grid segments extending between the active photodetectors, wherein the second blocking layer extends past outer sidewalls of the first blocking layer and is laterally spaced from the first plurality of active photodetectors.

7. The method of claim 6, wherein the first plurality of active photodetectors are distributed through the substrate in a grid pattern, and wherein the first photodetector is spaced from the first plurality of active photodetectors in a first direction.

8. The method of claim 6, wherein the planarization process results in the first blocking layer having a concave upper surface, and wherein a central portion of the first blocking layer has a lower thickness than a peripheral portion of the first blocking layer.

9. The method of claim 6, further comprising forming an etch stop layer over the substrate before depositing the second metal layer, wherein the patterning of the second metal layer results in openings in the second metal layer that extend to the etch stop layer.

10. The method of claim 6, wherein the second metal layer has a first portion overlying the first blocking layer and a second portion surrounding the first blocking layer, and wherein the deposition of the second metal layer results in the first portion having an upper surface a first height above the substrate and the second portion having an upper surface a second height above the substrate that is greater than the first height.

11. The method of claim 6, wherein the first blocking layer extends a first depth below the first side of the substrate, and the second blocking layer extends to a first height above the first side of the substrate, and wherein the first depth has a value within 10% of the first height.

12. A method of forming an integrated device, the method comprising:

forming a plurality of photodetectors in a central region and a peripheral region of a substrate;

etching a recess of a first depth into the peripheral region of the substrate;

depositing a first metal layer on a first side of the substrate and into the recess;

removing a portion of the first metal layer over the first side of the substrate, resulting in a first blocking layer remaining in the recess;

depositing a second metal layer with a first height over the first side of the substrate, the first height being within 10% of the first depth; and patterning the second metal layer to form a grid structure in the central region of the substrate and a second blocking layer over the first blocking layer in the peripheral region of the substrate.

13. The method of claim 12, wherein the grid structure comprises segments extending between photodetectors of the plurality of photodetectors.

14. The method of claim 12, further comprising:

forming isolation structures within the substrate isolating the photodetectors from one another.

15. The method of claim 14, wherein the grid structure comprises metal segments that directly overlie segments of the isolation structures.

16. The method of claim 12, wherein the plurality of photodetectors comprises a first plurality of photodetectors within the central region and a first photodetector within the peripheral region.

17. The method of claim 16, wherein the first blocking layer directly overlies the first photodetector, and wherein the second blocking layer directly overlies the first blocking layer.

18. The method of claim 17, wherein the second blocking layer extends past outer sidewalls of the first blocking layer in a first direction.

19. The method of claim 12, wherein the first blocking layer and the second blocking layer directly overly the plurality of photodetectors in the peripheral region.

20. The method of claim 12, wherein the recess surrounds the central region of the substrate.

* * * * *